US010327327B2

(12) United States Patent
Yamauchi et al.

(10) Patent No.: US 10,327,327 B2
(45) Date of Patent: Jun. 18, 2019

(54) PRINTED CIRCUIT BOARD AND METHOD OF MANUFACTURING THE SAME

(71) Applicant: Nitto Denko Corporation, Ibaraki-shi, Osaka (JP)

(72) Inventors: Daisuke Yamauchi, Ibaraki (JP); Hiroyuki Tanabe, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 11 days.

(21) Appl. No.: 15/696,270

(22) Filed: Sep. 6, 2017

(65) Prior Publication Data

US 2018/0070438 A1    Mar. 8, 2018

(30) Foreign Application Priority Data

Sep. 6, 2016   (JP) .................. 2016-173689

(51) Int. Cl.
| | |
|---|---|
| *H05K 1/02* | (2006.01) |
| *H05K 1/05* | (2006.01) |
| *H05K 1/11* | (2006.01) |
| *H05K 3/46* | (2006.01) |
| *G11B 5/48* | (2006.01) |
| *H05K 3/40* | (2006.01) |
| *H05K 1/09* | (2006.01) |
| *H05K 1/03* | (2006.01) |

(52) U.S. Cl.
CPC .......... *H05K 1/0224* (2013.01); *G11B 5/484* (2013.01); *G11B 5/486* (2013.01); *H05K 1/0225* (2013.01);
(Continued)

(58) Field of Classification Search
CPC ...... H05K 1/0224; H05K 1/115; H05K 1/056; H05K 3/4644; H05K 1/0228; H05K 2201/0195; H05K 1/09; H05K 2201/093; H05K 2201/10083; H05K 3/4038; H05K 2201/09254; H05K 2201/0154; H05K 2201/09227; G11B 5/484; G11B 5/486
See application file for complete search history.

(56) References Cited

U.S. PATENT DOCUMENTS

| | | | |
|---|---|---|---|
| 7,571,540 B2* | 8/2009 | Aonuma ................. | H05K 3/44 174/250 |
| 8,134,080 B2* | 3/2012 | Ishii ...................... | H05K 3/38 174/255 |

(Continued)

FOREIGN PATENT DOCUMENTS

| | | |
|---|---|---|
| JP | 2006245220 A | 9/2006 |
| JP | 3891912 B2 | 3/2007 |

(Continued)

*Primary Examiner* — Ishwarbhai B Patel
(74) *Attorney, Agent, or Firm* — Panitch Schwarze Belisario & Nadel LLP

(57) ABSTRACT

In a suspension board, a first insulating layer is formed on a support substrate. A ground layer and a power wiring trace are formed on the first insulating layer. The ground layer has electric conductivity higher than that of the support substrate. A second insulating layer is formed on the first insulating layer to cover the ground layer and the power wiring trace. A write wiring trace is formed on the second insulating layer to overlap with the ground layer. In a stacking direction of the support substrate, the first insulating layer and the second insulating layer, a distance between the ground layer and the write wiring trace is larger than a distance between the power wiring trace and the write wiring trace.

7 Claims, 22 Drawing Sheets

(52) U.S. Cl.
CPC .......... *H05K 1/0228* (2013.01); *H05K 1/056* (2013.01); *H05K 1/115* (2013.01); *H05K 3/4644* (2013.01); *H05K 1/0245* (2013.01); *H05K 1/0277* (2013.01); *H05K 1/0393* (2013.01); *H05K 1/053* (2013.01); *H05K 1/09* (2013.01); *H05K 3/4038* (2013.01); *H05K 2201/0154* (2013.01); *H05K 2201/0195* (2013.01); *H05K 2201/093* (2013.01); *H05K 2201/09227* (2013.01); *H05K 2201/09254* (2013.01); *H05K 2201/10083* (2013.01)

(56) References Cited

U.S. PATENT DOCUMENTS

| | | | |
|---|---|---|---|
| 8,760,815 B2 * | 6/2014 | Ishii | G11B 5/484 360/245.8 |
| 2004/0070884 A1 | 4/2004 | Someya et al. | |
| 2004/0246626 A1 * | 12/2004 | Wakaki | G11B 5/486 360/245.8 |
| 2006/0199402 A1 | 9/2006 | Ishii et al. | |
| 2008/0047739 A1 | 2/2008 | Ishii et al. | |
| 2008/0278858 A1 | 11/2008 | Ishii et al. | |
| 2009/0316300 A1 | 12/2009 | Kamei et al. | |

FOREIGN PATENT DOCUMENTS

| | | | |
|---|---|---|---|
| JP | 2008034639 | A | 2/2008 |
| JP | 2008282995 | A | 11/2008 |
| JP | 2010-003893 | A | 1/2010 |
| JP | 4403090 | B2 | 1/2010 |
| JP | 2012198950 | A | 10/2012 |
| JP | 5139169 | B2 | 2/2013 |

* cited by examiner

F I G. 2
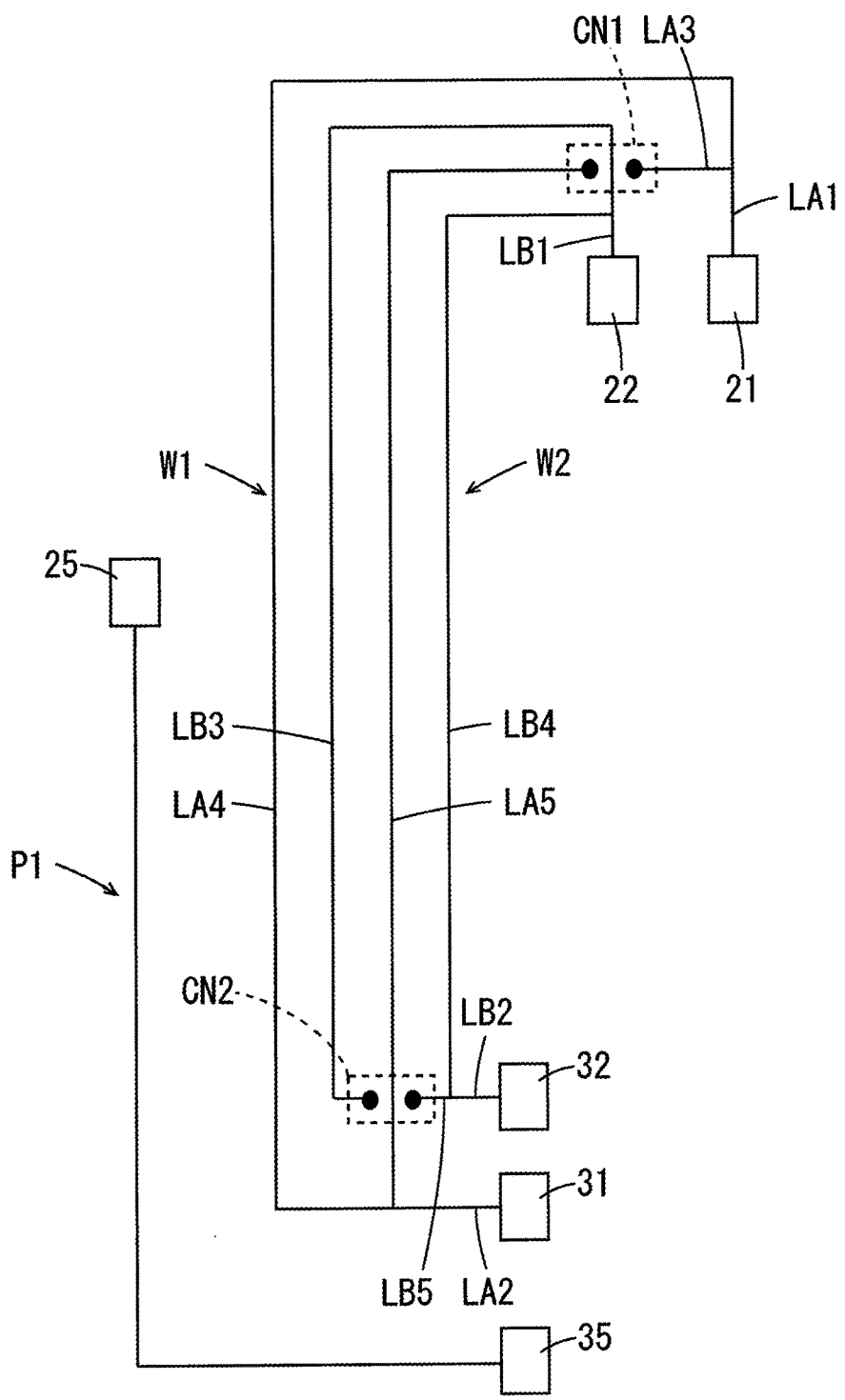

LINE A-A

LINE B-B

LINE C-C

LINE D-D

LINE A-A

LINE B-B

LINE D-D

LINE A-A

LINE B-B

LINE D-D

LINE A-A

LINE B-B

LINE D-D

LINE A-A

LINE B-B

LINE D-D

LINE A-A

LINE B-B

LINE C-C

LINE J1-J1

PRINTED CIRCUIT BOARD AND METHOD OF MANUFACTURING THE SAME

BACKGROUND OF THE INVENTION

Field of the Invention

The present invention relates to a printed circuit board and a method of manufacturing the printed circuit board.

Description of Related Art

Conventionally, printed circuit boards are used in various types of electric appliances or electronic appliances. In JP 2010-3893 A, a suspension board used for an actuator in a hard disc drive device is described as a printed circuit board.

In the printed circuit board described in JP 2010-3893 A, a first insulating layer is formed on a suspension main body. First and second wiring traces are formed on the first insulating layer to be spaced apart from each other and be in parallel to each other. Two second insulating layers are formed in two regions on the first insulating layer such that the first wiring trace and the second wiring trace are located between the two second insulating layers. A third wiring trace is formed in a region on the second insulating layer close to the second wiring trace, and a fourth wiring trace is formed in a region on the second insulating layer close to the first wiring trace.

The first wiring trace and the third wiring trace are connected to each other in a predetermined location, so that a first write wiring trace is constituted. The second wiring trace and the fourth wiring trace are connected to each other in a predetermined location, so that a second write wiring trace is constituted. The first write wiring trace and the second write wiring trace constitute a signal line pair.

In the printed circuit board described in JP 2010-3893 A, the first and second wiring traces are formed at positions lower than the third and fourth wiring traces. Therefore, as compared to the case where the first to fourth wiring traces are formed on the same plane, a distance between the first and third wiring traces, a distance between the second and fourth traces, a distance between the second and third traces, and a distance between the first and fourth traces are respectively large. This reduces the proximity effect among the first to fourth wiring traces. Thus, a loss of an electric signal transmitted through each of the first to fourth wiring traces is reduced.

BRIEF SUMMARY OF THE INVENTION

However, in recent years, electric signals used in electric appliances or electronic appliances have higher frequencies. Therefore, a further reduction in transmission loss of an electric signal in a high frequency band is required in the printed circuit board.

The present invention provides a printed circuit board in which a loss of an electric signal is reduced in a high frequency band, and a method of manufacturing the printed circuit board.

(1) A printed circuit board according to one aspect of the present invention includes a support substrate formed of a conductive material, a first insulating layer formed on the support substrate, a ground layer that is formed on the first insulating layer to be electrically connected to the support substrate and has electric conductivity higher than electric conductivity of the support substrate, a lower wiring trace formed on the first insulating layer, a second insulating layer formed on the first insulating layer to cover the ground layer and the lower wiring trace, and an upper wiring trace formed on the second insulating layer to overlap with the ground layer, wherein in a stacking direction of the support substrate, the first insulating layer and the second insulating layer, a distance between the ground layer and the upper wiring trace is larger than a distance between the lower wiring trace and the upper wiring trace.

In this printed circuit board, the first insulating layer is formed on the support substrate. The ground layer and the lower wiring trace are formed on the first insulating layer. Further, the second insulating layer is formed on the first insulating layer to cover the ground layer and the lower wiring trace. Further, the upper wiring trace is formed on the second insulating layer to overlap with the ground layer. In this case, an electric signal can be transmitted through each of the lower wiring trace and the upper wiring trace.

In the case where the electric signal having a high frequency band is transmitted through the upper wiring trace, electromagnetic waves are generated from the upper wiring trace. When the electromagnetic waves enter the support substrate or the ground layer, an eddy current is generated in the support substrate or the ground layer, and the upper wiring trace is electromagnetically coupled to the support substrate or the ground layer. A loss corresponding to the magnitude of the eddy current generated in the support substrate or the ground layer is generated in the electric signal transmitted through the upper wiring trace. The larger the eddy current is, the larger the loss of the electric signal is. The smaller the eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer has the electric conductivity higher than that of the support substrate. Therefore, an eddy current generated in the ground layer by electromagnetic waves is smaller than an eddy current generated in the support substrate by electromagnetic waves.

In the above-mentioned configuration, the ground layer is located between at least part of the upper wiring trace and the support substrate, so that electromagnetic waves radiated from the upper wiring trace towards the support substrate at least partially enter the ground layer and do not reach the support substrate. Further, the larger the distance between the ground layer and the upper wiring trace is, the smaller the eddy current generated in the ground layer is.

Further, the distance between the ground layer and the upper wiring trace in the stacking direction is larger than the distance between the lower wiring trace and the upper wiring trace in the stacking direction. Therefore, as compared to the case where the distance between the ground layer and the upper wiring trace in the stacking direction is equal to or smaller than the distance between the lower wiring trace and the upper wiring trace in the stacking direction, the eddy current generated in the ground layer is small. As a result, a loss of the electric signal transmitted through the upper wiring trace in the high frequency band is reduced.

(2) The first insulating layer may include a first portion having a first thickness and a second portion having a second thickness larger than the first thickness, the ground layer may be formed on the first portion of the first insulating layer, and the lower wiring trace may be formed on the second portion of the first insulating layer. In this case, the distance between the ground layer and the upper wiring trace in the stacking direction can easily be larger than the distance between the lower wiring trace and the upper wiring trace in the stacking direction.

(3) A first opening may be formed in the support substrate, a second opening overlapping with the first opening of the support substrate may be formed in the ground layer, and the upper wiring trace may at least partially overlap with the second opening of the ground layer.

A value of the characteristic impedance of the upper wiring trace is determined according to an area in which the upper wiring trace overlaps with the support substrate and the ground layer. In the above-mentioned configuration, the first and second openings are respectively formed in the support substrate and the ground layer. Therefore, it is possible to easily adjust a value of the characteristic impedance of the upper wiring trace by adjusting the sizes and the numbers of first and second openings.

(4) A dimension of the second opening of the ground layer may be set such that the ground layer is partially present between the upper wiring trace and the support substrate. In this case, electromagnetic waves radiated from the upper wiring trace towards the support substrate can be inhibited from reaching the support substrate while the first and second openings are respectively provided in the support substrate and the ground layer. Thus, a loss of an electric signal transmitted through the upper wiring trace in the higher frequency band can be reduced while a value of the characteristic impedance of the upper wiring trace is adjusted to a desired value.

(5) A printed circuit board according to another aspect of the present invention includes a support substrate formed of a conductive material, a first insulating layer formed on the support substrate, a ground layer that is formed on the first insulating layer to be electrically connected to the support substrate and has electric conductivity higher than electric conductivity of the support substrate, a second insulating layer formed on the first insulating layer to cover the ground layer, and an upper wiring trace formed on the second insulating layer to overlap with the ground layer, wherein a first opening is formed in the support substrate, a second opening overlapping with the first opening of the support substrate is formed in the ground layer, the upper wiring trace at least partially overlaps with the second opening of the ground layer, and a dimension of the second opening of the ground layer is set such that the ground layer is partially present between the upper wiring trace and the support substrate.

In this printed circuit board, the first insulating layer is formed on the support substrate. The ground layer is formed on the first insulating layer. Further, the second insulating layer is formed on the first insulating layer to cover the ground layer. Further, the upper wiring trace is formed on the second insulating layer to overlap with the ground layer. In this case, an electric signal can be transmitted through the upper wiring trace.

In the case where an electric signal having a higher frequency band is transmitted through the upper wiring trace, electromagnetic waves are generated from the upper wiring trace. When the electromagnetic waves enter the support substrate or the ground layer, an eddy current is generated in the support substrate or the ground layer, and the upper wiring trace is electromagnetically coupled to the support substrate or the ground layer. A loss corresponding to the magnitude of the eddy current generated in the support substrate or the ground layer is generated in the electric signal transmitted through the upper wiring trace. The larger the eddy current is, the larger the loss of the electric signal is. The smaller the eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer has the electric conductivity higher than that of the support substrate. Therefore, an eddy current generated in the ground layer by electromagnetic waves is smaller than an eddy current generated in the support substrate by electromagnetic waves.

In the above-mentioned configuration, because the ground layer is located between at least part of the upper wiring trace and the support substrate, the electromagnetic waves radiated from the upper wiring trace towards the support substrate at least partially enter the ground layer, and do not reach the support substrate. Thus, a loss of the electric signal transmitted through the upper wiring trace in a high frequency band is reduced.

Further, a value of the characteristic impedance of the upper wiring trace is determined according to an area in which the upper wiring trace overlaps with the support substrate and the ground layer. In the above-mentioned configuration, the first and second openings are respectively formed in the support substrate and the ground layer. Therefore, it is possible to easily adjust the value of the characteristic impedance of the upper wiring trace by adjusting the sizes and the numbers of the first and second openings.

Further, a dimension of the second opening of the ground layer is set such that the ground layer is partially present between the upper wiring trace and the support substrate. Therefore, the electromagnetic waves radiated from the upper wiring trace towards the support substrate can be inhibited from reaching the support substrate while the first and second openings are respectively provided in the support substrate and the ground layer. Thus, the loss of the electric signal transmitted through the upper wiring trace in a high frequency band can be reduced while a value of the characteristic impedance of the upper wiring trace is adjusted to a desired value.

(6) The upper wiring trace may extend in a first direction, and a plurality of the second openings may intermittently be formed to be arranged in the first direction. In this case, the plurality of first openings are intermittently arranged in the first direction together with the plurality of second openings. Thus, uniformity of the characteristic impedance of the upper wiring trace can be improved.

(7) The printed circuit board may further include first and second vias that penetrate the first and second insulating layers, wherein the support substrate may include a support portion electrically connected to the ground layer and a wiring portion electrically insulated from the support portion, the upper wiring trace may include first and second signal lines that constitute a signal line pair, the first signal line may include first and second branch lines, the second signal line may include third and fourth branch lines electrically connected to each other, the first and second branch lines of the first signal line and the third and fourth branch lines of the second signal line may be arranged such that any one of the first and second branch lines is located between the third and fourth branch lines, the first via may electrically connect the first branch line of the first signal line to the wiring portion of the support substrate, and the second via may electrically connect the second branch line of the first signal line to the wiring portion of the support substrate.

In this case, part of the first branch line and a remaining part of the first branch line of the first signal line are electrically connected to each other through the first via, the wiring portion and the second via. Thus, the first branch line is formed on the second insulating layer such that the part of the first branch line and the remaining part of the first branch line are spaced apart from each other. In this state, the third or fourth branch line can be formed on the second insulating layer to pass between the part of the first branch line and the remaining part of the first branch line. Therefore, the first and second branch lines and the third and fourth branch lines can be arranged on the second insulating layer such that any one of the first and second branch lines is located between the third and fourth branch lines.

The first and second branch lines and the third and fourth branch lines are arranged such that any one of the first and second branch lines is located between the third and fourth branch lines. Thus, three side surfaces among one side surface and another side surface of the first branch line and one side surface and another side surface of the second branch line face three side surfaces among one side surface and another side surface of the third branch line and one side surface and another side surface of the fourth branch line. Thus, an area in which the first signal line and the second signal line are opposite to each other is increased, so that the capacitance of the upper wiring trace is increased. This results in reduced characteristic impedance of each of the first and second signal lines.

(8) The printed circuit board may further include a relay trace formed on the first insulating layer, and first and second vias that penetrate the second insulating layer, wherein the upper wiring trace may include first and second signal lines that constitute a signal line pair, the first signal line may include first and second branch lines, the second signal line may include third and fourth branch lines electrically connected to each other, the first and second branch lines of the first signal line and the third and fourth branch lines of the second signal line may be arranged such that any one of the first and second branch lines is located between the third and fourth branch lines, the first via may electrically connect the first branch line of the first signal line to the relay trace, and the second via may electrically connect the second branch line of the first signal line to the relay trace.

In the above-mentioned configuration, the part of the first branch line and the remaining part of the first branch line of the first signal line are electrically connected to each other through the first via, the relay trace and the second via. Thus, the first branch line can be formed on the second insulating layer such that the part of the first branch line and the remaining part of the first branch line are spaced apart from each other. Further, the third or fourth branch line can be formed on the second insulating layer to pass between the part of the first branch line and the remaining part of the first branch line. Therefore, the first and second branch lines and the third and fourth branch lines can be arranged on the second insulating layer such that any one of the first and second branch lines is located between the third and fourth branch lines.

The first and second branch lines and the third and fourth branch lines are arranged such that any one of the first and second branch lines is located between the third and fourth branch lines. Thus, three side surfaces among one side surface and another side surface of the first branch line and one side surface and another side surface of the second branch line face three side surfaces among one side surface and another side surface of the third branch line and one side surface and another side surface of the fourth branch line. Thus, an area in which the first signal line and the second signal line are opposite to each other is increased, so that the capacitance of the upper wiring trace is increased. This results in reduced characteristic impedance of the first and second signal lines.

(9) The printed circuit board may further include a third via that penetrates the first insulating layer and electrically connects the ground layer and the support substrate to each other. In this case, the ground layer can be easily electrically connected to the support substrate through the third via.

(10) The support substrate may include stainless, and the ground layer includes copper. In this case, sufficient rigidity required to support the upper wiring trace can be ensured by stainless steel. Further, a passive film is formed on the surface of the stainless steel. Thus, deterioration of the support substrate due to erosion is inhibited. Copper has electric conductivity higher than that of stainless steel. Thus, an eddy current generated in the ground layer by the electromagnetic waves can be reduced.

(11) The printed circuit board may further include a third insulating layer formed on the second insulating layer to cover the upper wiring trace. In this case, the upper wiring trace is protected by the third insulating layer.

(12) A method of manufacturing a printed circuit board according to yet another aspect of the present invention includes the steps of preparing a first insulating layer stacked on a support substrate formed of a conductive material, forming a ground layer having electric conductivity higher than electric conductivity of the support substrate on the first insulating layer such that the ground layer is electrically connected to the support substrate, and forming a lower wiring trace on the first insulating layer, forming a second insulating layer on the first insulating layer such that the second insulating layer covers the ground layer and the lower wiring trace, and forming an upper wiring trace on the second insulating layer such that the upper wiring trace overlaps with the ground layer, wherein the step of forming the ground layer and the lower wiring trace includes forming the ground layer and the lower wiring trace such that, in a stacking direction of the support substrate, the first insulating layer and the second insulating layer, a distance between the ground layer and the upper wiring trace is larger than a distance between the lower wiring trace and the upper wiring trace.

In this method of manufacturing the printed circuit board, the first insulating layer is formed on the support substrate. The ground layer and the lower wiring trace are formed on the first insulating layer. Further, the second insulating layer is formed on the first insulating layer to cover the ground layer and the lower wiring trace. Further, the upper wiring trace is formed on the second insulating layer to overlap with the ground layer. In this case, an electric signal can be transmitted through each of the lower wiring trace and the upper wiring trace.

In the case where an electric signal having a high frequency band is transmitted through the upper wiring trace, electromagnetic waves are generated from the upper wiring trace. When the electromagnetic waves enter the support substrate or the ground layer, an eddy current is generated in the support substrate or the ground layer, and the upper wiring trace is electromagnetically coupled to the support substrate or the ground layer. A loss corresponding to the magnitude of the eddy current generated in the support substrate or the ground layer is generated in an electric signal transmitted through the upper wiring trace. The larger the eddy current is, the larger the loss of the electric signal is. The smaller the eddy current is, the smaller the loss of the electric signal is.

As for an eddy current generated in a conductor when electromagnetic waves are supplied to the conductor, the lower the electric conductivity of the conductor is, the larger the eddy current is. The higher the electric conductivity of the conductor is, the smaller the eddy current is. The ground layer has the electric conductivity higher than that of the support substrate. Therefore, an eddy current generated in the ground layer by the electromagnetic waves is smaller than an eddy current generated in the support substrate by the electromagnetic waves.

In the above-mentioned manufacturing method, because the ground layer is located between at least part of the upper wiring trace and the support substrate, the electromagnetic waves radiated from the upper wiring trace towards the support substrate at least partially enter the ground layer and do not reach the support substrate. Further, the larger a distance between the ground layer and the upper wiring trace is, the smaller an eddy current generated in the ground layer is.

Further, the distance between the ground layer and the upper wiring trace in the stacking direction is larger than the distance between the lower wiring trace and the upper wiring trace in the stacking direction. Therefore, as compared to the case where the distance between the ground layer and the upper wiring trace in the stacking direction is equal to or smaller than the distance between the lower wiring trace and the upper wiring trace in the stacking direction, an eddy current generated in the ground layer is small. This results in the reduced loss of the electric signal transmitted through the upper wiring trace in the high frequency band.

(13) A method of manufacturing a printed circuit board according to yet another aspect of the present invention includes the steps of preparing a first insulating layer stacked on a support substrate formed of a conductive material, forming a ground layer having electric conductivity higher than electric conductivity of the support substrate on the first insulating layer such that the ground layer is electrically connected to the support substrate, forming a second insulating layer on the first insulating layer such that second insulating layer covers the ground layer, forming an upper wiring trace on the second insulating layer such that the upper wiring trace overlaps with the ground layer, and forming a first opening in the support substrate, forming a second opening overlapping with the first opening of the support substrate in the ground layer, wherein the step of forming the upper wiring trace includes forming the upper wiring trace such that the upper wiring trace at least partially overlaps with the second opening of the ground layer, and the step of forming the second opening includes setting a dimension of the second opening such that the ground layer is partially present between the upper wiring trace and the support substrate.

In this method of manufacturing the printed circuit board, the first insulating layer is formed on the support substrate. The ground layer is formed on the first insulating layer. Further, the second insulating layer is formed on the first insulating layer to cover the ground layer. Further, the upper wiring trace is formed on the second insulating layer to overlap with the ground layer. In this case, an electric signal can be transmitted through the upper wiring trace.

In the case where an electric signal having a high frequency band is transmitted through the upper wiring trace, electromagnetic waves are generated from the upper wiring trace. When the electromagnetic waves enter the support substrate or the ground layer, an eddy current is generated in the support substrate or the ground layer, and the upper wiring trace is electromagnetically coupled to the support substrate or the ground layer. A loss corresponding to the magnitude of the eddy current generated in the support substrate or the ground layer is generated in the electric signal transmitted through the upper wiring trace. The larger the eddy current is, the larger the loss of the electric signal is. The smaller the eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer has electric conductivity higher than that of the support substrate. Therefore, an eddy current generated in the ground layer by electromagnetic waves is smaller than an eddy current generated in the support substrate by the electromagnetic waves.

In the above-mentioned manufacturing method, because the ground layer is located between at least part of the upper wiring trace and the support substrate, electromagnetic waves radiated from the upper wiring trace towards the support substrate at least partially enter the ground layer and do not reach the support substrate. Thus, a loss of an electric signal transmitted through the upper wiring trace in the high frequency band is reduced.

Further, a value of the characteristic impedance of the upper wiring trace is determined according to an area in which the upper wiring trace overlaps with the support substrate and the ground layer. In the above-mentioned configuration, the first and second openings are respectively formed in the support substrate and the ground layer. Therefore, it is possible to easily adjust the value of the characteristic impedance of the upper wiring trace by adjusting the sizes and the numbers of the first and second openings.

Further, the dimension of the second opening of the ground layer is set such that the ground layer is partially present between the upper wiring trace and the support substrate. Therefore, the electromagnetic waves radiated from the upper wiring trace towards the support substrate can be inhibited from reaching the support substrate while the first and second openings are respectively provided in the support substrate and the ground layer. Thus, a loss of the electric signal transmitted through the upper wiring trace in a high frequency band can be reduced while the value of the characteristic impedance of the upper wiring trace is adjusted to a desired value.

Other features, elements, characteristics, and advantages of the present invention will become more apparent from the following description of preferred embodiments of the present invention with reference to the attached drawings.

BRIEF DESCRIPTION OF THE SEVERAL
VIEWS OF THE DRAWING

FIG. 2 is a schematic diagram showing configurations of write wiring traces and a power wiring trace of FIG. 1;

Figure 28:
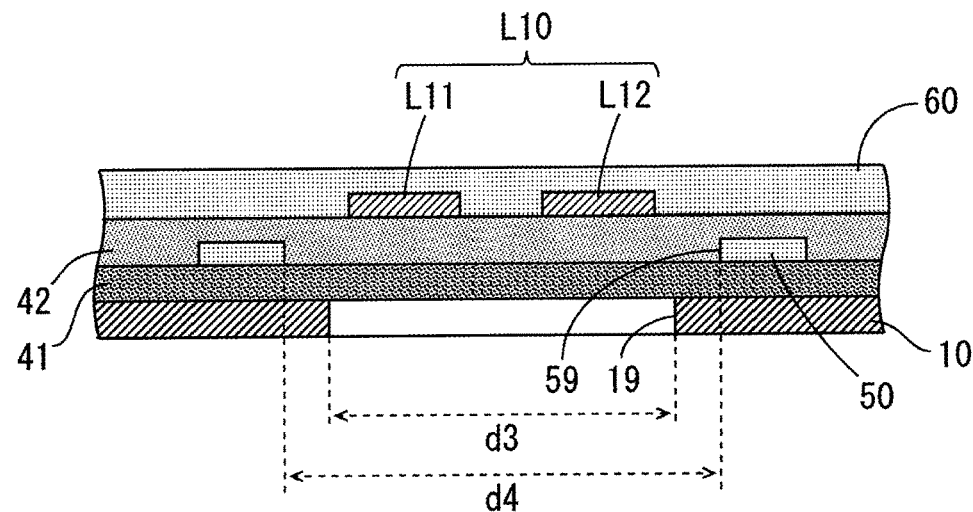
Figure 29:
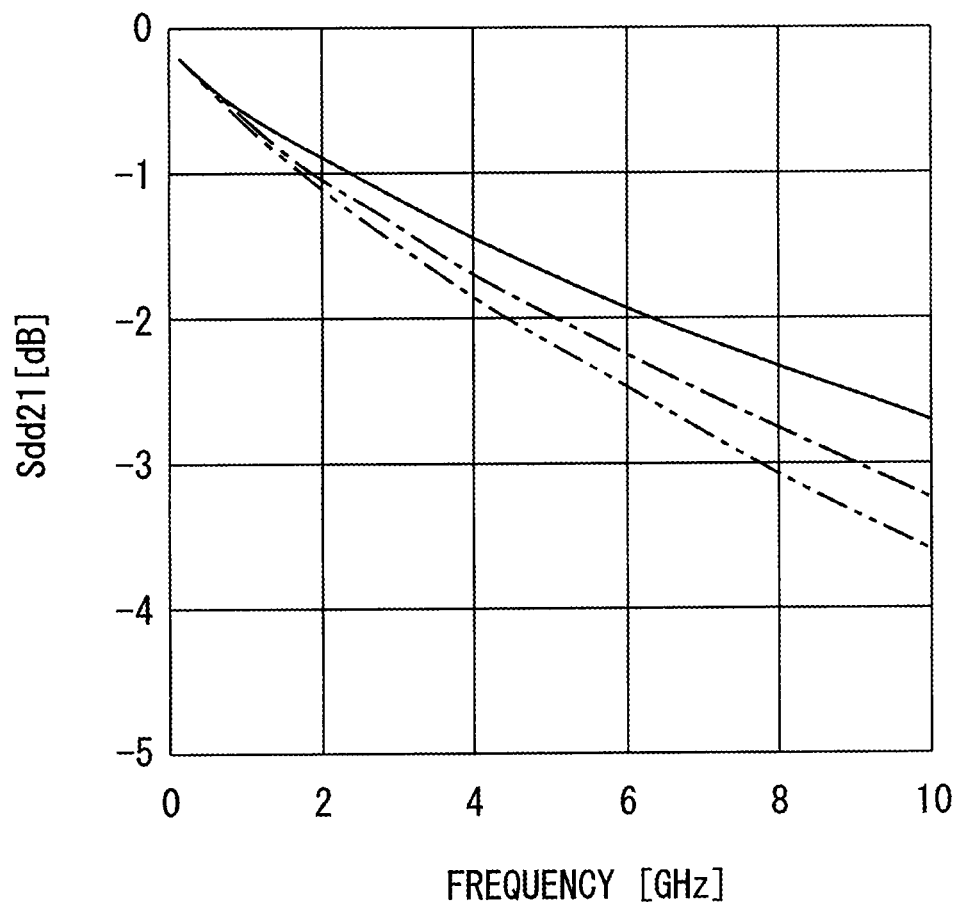

FIG. 28 is a cross sectional view of a suspension board according to a comparative example 4; and FIG. 29 is a diagram showing results of simulation relating to the suspension boards according to the inventive example 3 and the comparative examples 3, 4.

DESCRIPTION OF THE PREFERRED EMBODIMENTS

A printed circuit board and a method of manufacturing the printed circuit board according to one embodiment of the present invention will be described below with reference to drawings. A suspension board having a circuit (hereinafter abbreviated as a suspension board) used for an actuator of a hard disc drive device will be described as the printed circuit board according to the one embodiment of the present invention.

[1] First Embodiment (1) Structure of Suspension Board

Figure 1:
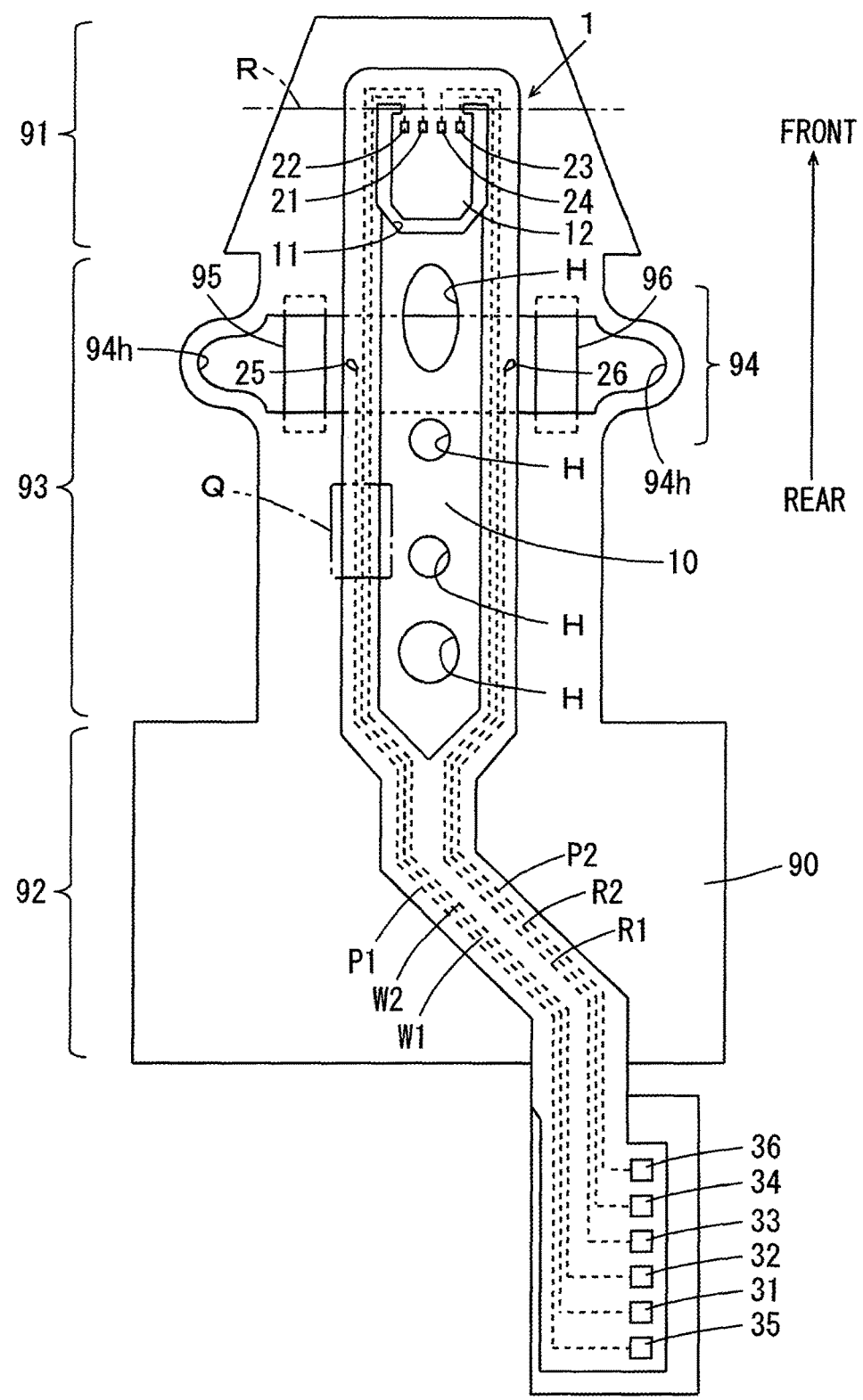
FIG. 1 is a plan view of a suspension board according to a first embodiment of the present invention.

FIG. 1 is a plan view of the suspension board according to the first embodiment of the present invention. In FIG. 1, a direction in which an arrow is directed is referred to as forward, and the opposite direction is referred to as rearward. As shown in FIG. 1, the suspension board 1 includes a support substrate 10 made of stainless steel, for example, as a suspension main body. In FIG. 1, the support substrate 10 extends in a substantially front-and-rear direction.

The suspension board 1 is supported by an elongated support plate 90. As indicated by dotted lines in FIG. 1, write wiring traces W1, W2, read wiring traces R1, R2 and power wiring traces P1, P2 are formed on the suspension board 1. Each of the write wiring traces W1, W2 and the read wiring traces R1, R2 is a high frequency line for allowing an electric signal having a high frequency band to be transmitted therethrough. Each of the power wiring traces P1, P2 is a low frequency line for allowing an electric signal, having a frequency band lower than that of the electric signal transmitted through each of the write wiring traces W1, W2 and the read wiring traces R1, R2, to be transmitted therethrough.

At a tip end of the support substrate 10, a magnetic head supporting portion (hereinafter referred to as a tongue) 12 is provided by forming a U-shaped opening 11. The tongue 12 is bent along a one-dot and dash line R to form a predetermined angle with the support substrate 10.

Four connection terminals 21, 22, 23, 24 are formed on an upper surface of the tongue 12 at one end of the support substrate 10. Further, two connection terminals 25, 26 are respectively formed on both sides in the vicinity of a center portion of the support substrate 10 in a direction in which the support substrate 10 extends (the front-and-rear direction). A head slider (not shown) having a magnetic head is mounted on the upper surface of the tongue 12. Terminals of the magnetic head of the head slider are connected to the connection terminals 21 to 24 of the tongue 12. The connection terminals 25, 26 are connected to two piezoelectric elements 95, 96, described below, respectively.

Six connection terminals 31, 32, 33, 34, 35, 36 are formed on an upper surface at the other end of the support substrate 10. Electric circuits such as a preamplifier are connected to the connection terminals 31 to 34. Power circuits for the piezoelectric elements 95, 96 are connected to the connection terminals 35, 36. The connection terminals 21 to 26 are respectively electrically connected to the connection terminals 31 to 36 by the write wiring traces W1, W2, the read wiring traces R1, R2 and the power wiring traces P1, P2. Further, a plurality of holes H are formed in the center portion of the support substrate 10.

The support plate 90 has a front end region 91, a rear end region 92 and a center region 93. The rear end region 92 is rectangular. The front end region 91 is trapezoidal, and its width is gradually reduced forward. The center region 93 has a rectangular shape extending in the front-and-rear direction, and is arranged between the front end region 91 and the rear end region 92. With the suspension board 1 supported by an upper surface of the support plate 90, an end portion of the suspension board 1 including the connection terminals 31 to 36 projects rearward from the rear end region 92.

A piezoelectric element mounting region 94 is provided in one portion of the center region 93. The piezoelectric element mounting region 94 overlaps with the connection terminals 25, 26 of the suspension board 1. Both of side portions of the piezoelectric element mounting region 94 project to be curved outward. Further, a through hole 94h extending in a width direction (a direction orthogonal to the front-and-rear direction) is formed in the piezoelectric element mounting region 94. In this configuration, a portion of the piezoelectric element mounting region 94 of the support plate 90 is stretchable in the front-and-rear direction.

The piezoelectric elements 95, 96 are mounted on a lower surface of the piezoelectric element mounting region 94 so as to cross the through hole 94h. The piezoelectric elements 95, 96 are respectively located on both sides of the suspension board 1. The piezoelectric elements 95, 96 are respectively connected to the connection terminals 25, 26 of the suspension board 1 through the through hole 94h.

A voltage is added to the piezoelectric element 95 through the connection terminals 25, 35 and the power wiring trace P1, and a voltage is added to the piezoelectric element 96 through the connection terminals 26, 36 and the power wiring trace P2. Thus, with a stretch of the piezoelectric elements 95, 96, the support plate 90 is stretched in the front-and-rear direction. It is possible to subtly position the magnetic head of the head slider on the suspension board 1 by controlling the voltages added to the piezoelectric elements 95, 96.

The suspension board 1 supported by the support plate 90 is provided in the hard disc device. An electric current flows in the pair of write wiring traces W1, W2 at a time of writing the information in a magnetic disc. The write wiring trace W1 and the write wiring trace W2 constitute a differential signal line pair through which differential write signals are transmitted. Further, an electric current flows in the pair of read wiring traces R1, R2 at a time of reading the information from the magnetic disc. The read wiring trace R1 and the read wiring trace R2 constitute a differential signal line pair through which differential read signals are transmitted.

(2) Write Wiring Traces and Power Wiring Trace

Configurations of the write wiring traces W1, W2 and the power wiring trace P1 will be described. FIG. 2 is a schematic diagram showing the configurations of the write wiring traces W1, W2 and the power wiring trace P1 of FIG. 1.

As shown in FIG. 2, the write wiring trace W1 is constituted by lines LA1 to LA5. One end of the line LA1 is connected to the connection terminal 21, and one end of the line LA2 is connected to the connection terminal 31. One end of each of the lines LA3, LA4 is integrated with the other end of the line LA1. The other end of the line LA3 and one end of the line LA5 are electrically connected to each other in an intersection region CN1. Details of the intersection region CN1 will be described below. The other end of each of the lines LA4, LA5 is integrated with the other end of the line LA2.

The write wiring trace W2 is constituted by lines LB1 to LB5. One end of the line LB1 is connected to the connection terminal 22, and one end of the line LB2 is connected to the connection terminal 32. One end of each of the lines LB3, LB4 is integrated with the other end of the line LB1. The other end of the line LB3 and one end of the line LB5 are electrically connected to each other in an intersection region CN2. Details of the intersection region CN2 will be described below. The other end of each of the lines LB4, LB5 is integrated with the other end of the line LB2.

The lines LA4, LA5 of the write wiring trace W1 and the lines LB3, LB4 of the write wiring trace W2 are arranged to be in parallel to each other such that the line LA5 is arranged between the lines LB3, LB4. The line LA5 of the write wiring trace W1 extends to pass through a portion between the ends of the lines LB3, LB5 of the write wiring trace W2 in the intersection region CN2, and the line LB3 of the write wiring trace W2 extends to pass through a portion between the ends of the lines LA3, LA5 of the write wiring trace W1 in the intersection region CN1.

The power wiring trace P1 is provided at a position spaced apart from the write wiring traces W1, W2 to connect the two connection terminals 25, 35 to each other.

Figure 3:
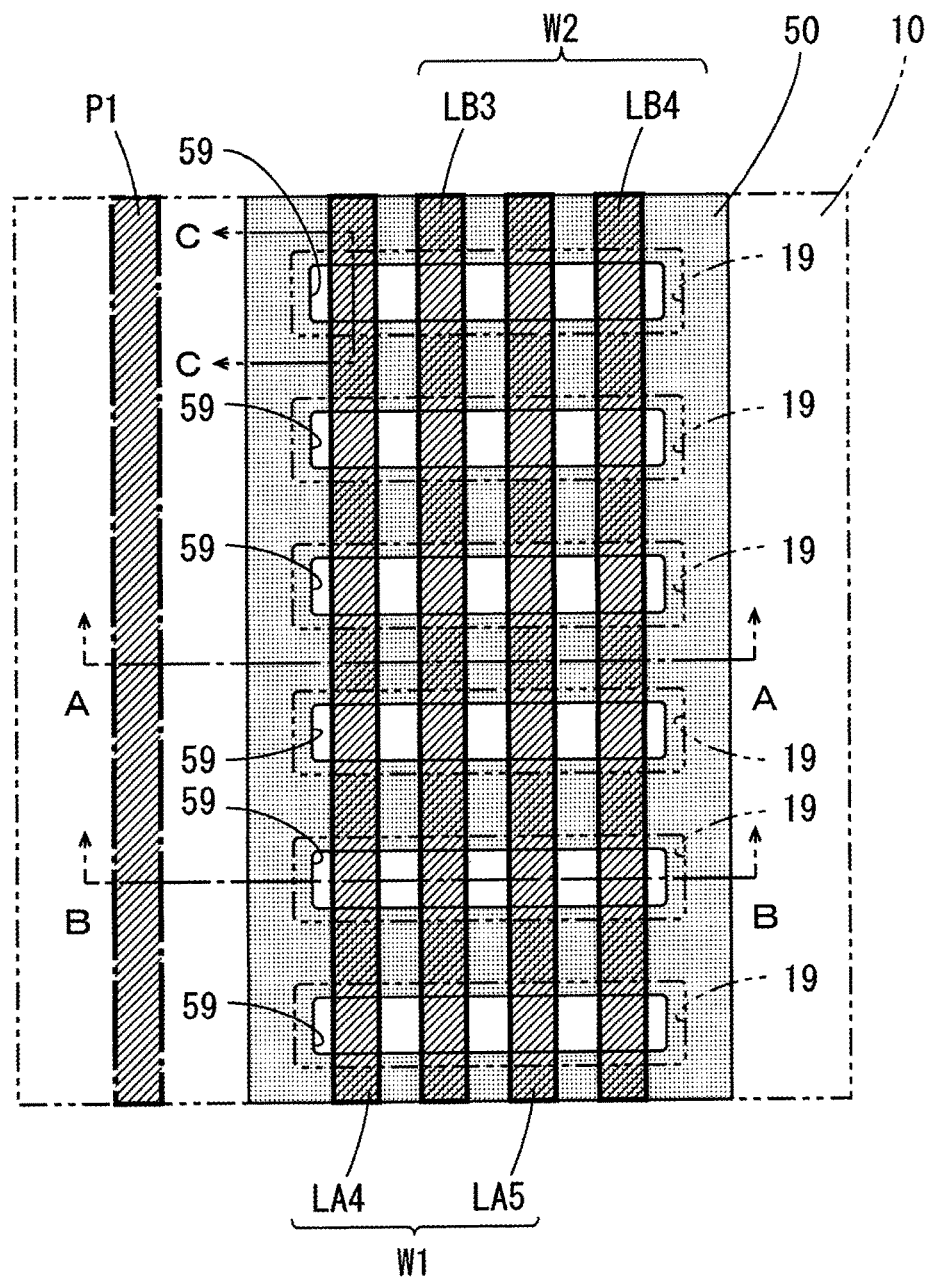
FIG. 3 is an enlarged plan view of a portion Q, surrounded by a one-dot and dash line, of the suspension board of FIG. 1.
Figure 4:
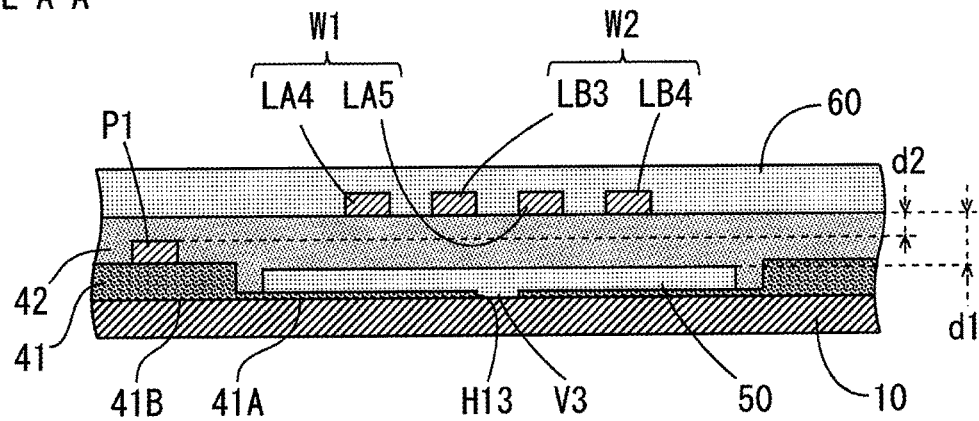
FIG. 4 is a cross sectional view taken along the line A-A of FIG. 3.
Figure 5:
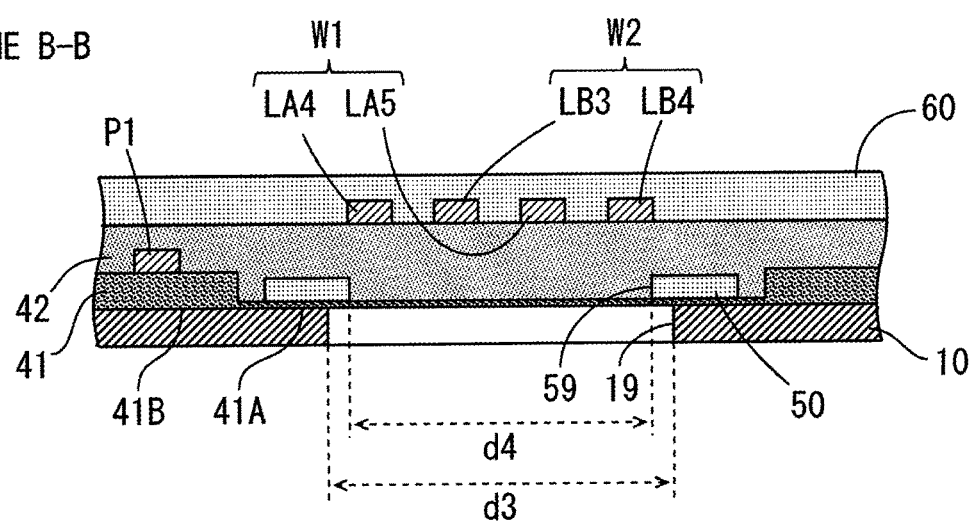
FIG. 5 is a cross sectional view taken along the line B-B of FIG. 3.
Figure 6:
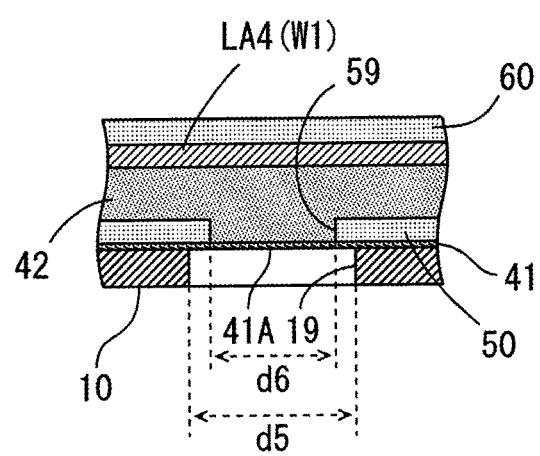
FIG. 6 is a cross sectional view taken along the line C-C of FIG. 3.

FIG. 3 is an enlarged plan view of a portion Q surrounded by a one-dot and dash line of the suspension board 1 of FIG. 1. FIG. 4 is a cross sectional view taken along the line A-A of FIG. 3. FIG. 5 is a cross sectional view taken along the line B-B of FIG. 3. FIG. 6 is a cross sectional view taken along the line C-C of FIG. 3. As shown in FIG. 3, in the portion Q of FIG. 1, the lines LA4, LA5, LB3, LB4 of the write wiring traces W1, W2 and the power wiring trace P1 are formed to be arranged in a direction orthogonal to the front-and-rear direction.

As shown in FIG. 4, a first insulating layer 41 made of polyimide, for example, is formed on the support substrate 10. The first insulating layer 41 has a thin portion 41A and a thick portion 41B. The thickness of the thick portion 41B is larger than the thickness of the thin portion 41A.

A ground layer 50 having electric conductivity higher than that of the support substrate 10 is formed on the thin portion 41A of the first insulating layer 41. As a material for the ground layer 50, copper is used, for example. In the case where the support substrate 10 is made of stainless steel, gold or silver may be used as the material for the ground layer 50. Alternatively, an alloy that includes any of gold, silver and copper and has electric conductivity higher than that of the stainless steel may be used as the material for the ground layer 50.

The ground layer 50 may have a multilayer structure. For example, in the case where the support substrate 10 is made of stainless steel, the ground layer 50 may have a two-layer structure in which a nickel layer or a silver layer is stacked on a copper layer or a three-layer structure in which a nickel layer and a gold layer are stacked on a copper layer. In the case where the ground layer 50 has the multilayer structure including a copper layer, another metal layer such as a nickel layer, a silver layer, a gold layer or the like may be formed on an upper surface and a side surface of the copper layer to cover the surfaces of the copper layer.

A through hole H13 is formed in a portion of the thin portion 41A of the first insulating layer 41 below the ground layer 50. The ground layer 50 is in contact with the support substrate 10 in the through hole H13. A via V3 is formed of a portion of the ground layer 50 in the through hole H13. Thus, the ground layer 50 is electrically connected to the support substrate 10 through the via V3.

The power wiring trace P1 is formed on the thick portion 41B of the first insulating layer 41 as a lower wiring trace of the present invention. As a material for the power wiring trace P1, copper is used, for example. Surfaces of the power wiring trace P1 may be covered by a nickel layer, a silver layer or the like.

A second insulating layer 42 made of polyimide, for example, is formed on the first insulating layer 41 to cover the ground layer 50 and the power wiring trace P1. In the present example, the second insulating layer 42 is formed to further be in contact with the ground layer 50.

The lines LA4, LA5, LB3, LB4 of the write wiring traces W1, W2 are formed on the second insulating layer 42 as upper wiring traces of the present invention. The lines LA4, LA5, LB3, LB4 of the write wiring traces W1, W2 at least partially overlap with the ground layer 50. As a material for the write wiring traces W1, W2, copper is used, for example. A third insulating layer 60 made of polyimide, for example, is formed on the second insulating layer 42 to cover the write wiring traces W1, W2. Surfaces of the write wiring traces W1, W2 may be covered by a nickel layer, a silver layer or the like.

In the above-mentioned configuration, in a stacking direction of the support substrate 10, the first insulating layer 41 and the second insulating layer 42 (hereinafter referred to as a substrate stacking direction), a distance d1 between the ground layer 50 and the write wiring trace W1 is set larger than a distance d2 between the power wiring trace P1 and the write wiring trace W1.

In FIG. 3, the first insulating layer 41, the second insulating layer 42 and the third insulating layer 60 of FIG. 4 are not shown. Further, in FIG. 3, the write wiring traces W1, W2 are indicated by thick solid lines and hatching, the power wiring trace P1 is indicated by a thick one-dot and dash line and hatching, and the ground layer 50 is indicated by a solid line and a dotted pattern. Further, the support substrate 10 is indicated by a two-dots and dash line.

In the case where an electric signal having a high frequency band is transmitted through each of the write wiring traces W1, W2, electromagnetic waves are generated from each of the write wiring traces W1, W2. When the generated electromagnetic waves enter the support substrate 10 or the ground layer 50, an eddy current is generated in the support substrate 10, and each of the write wiring traces W1, W2 is electromagnetically coupled to the support substrate 10 or the ground layer 50. The loss, corresponding to the magnitude of the eddy current generated in the support substrate 10 or the ground layer 50, is generated in the electric signal transmitted through each of the write wiring traces W1, W2. The larger the generated eddy current is, the larger the loss of the electric signal is. Further, the smaller the generated eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer 50 has the electric conductivity higher than that of the support substrate 10. Therefore, an eddy current generated in the ground layer 50 by electromagnetic waves is smaller than an eddy current generated in the support substrate 10 by electromagnetic waves.

In the above-mentioned configuration, because the ground layer 50 is located between at least part of each of the write wiring traces W1, W2 and the support substrate 10, electromagnetic waves radiated from the write wiring traces W1, W2 towards the support substrate 10 at least partially enter the ground layer 50 and do not reach the support substrate 10. Further, the larger a distance between the ground layer 50 and each of the write wiring traces W1, W2 is, the smaller an eddy current generated in the ground layer 50 is. In the above-mentioned configuration, the distance d1 (FIG. 4) between the ground layer 50 and each of the write wiring traces W1, W2 in the substrate stacking direction is larger than the distance d2 (FIG. 4) between the power wiring trace P1 and the write wiring trace W1 in the substrate stacking direction. Therefore, an eddy current generated in the ground layer 50 is small as compared to the case where the ground layer 50 is formed on the thick portion 41B of the first insulating layer 41. This results in the reduced loss of the electric signal transmitted through each of the write wiring traces W1, W2 in a high frequency band.

A value of characteristic impedance of each of the write wiring traces W1, W2 is determined according to an area in which each of the write wiring traces W1, W2 overlaps with the support substrate 10 and the ground layer 50. For example, as compared to the case where the write wiring trace W1 partially overlaps with the support substrate 10 and the ground layer 50, in the case where the entire write wiring trace W1 overlaps with the support substrate 10 and the ground layer 50, a value of characteristic impedance of the write wiring trace W1 is small. Further, as compared to the case where the write wiring trace W1 does not overlap with the support substrate 10 and the ground layer 50, in the case where the write wiring trace W1 partially overlaps with the support substrate 10 and the ground layer 50, a value of characteristic impedance is small.

Then, in the present embodiment, the area in which each of the write wiring traces W1, W2 overlaps with the support substrate 10 and the ground layer 50 is adjusted such that a value of characteristic impedance of each of the write wiring traces W1, W2 is close to a desired value. Specifically, as shown in FIGS. 3, 5 and 6, a plurality of first openings 19 overlapping with each of the write wiring traces W1, W2 are formed in the support substrate 10 according to the preset impedance. Further, a plurality of second openings 59 that respectively overlap with the plurality of first openings 19 are formed in the ground layer 50.

The plurality of first openings 19 and the plurality of second openings 59 are intermittently formed to be basically arranged in a direction in which each of the write wiring traces W1, W2 extends. Thus, the uniformity of the characteristic impedance of each of the write wiring traces W1, W2 can be improved.

Depending on the set impedance, the plurality of first openings 19 and the plurality of second openings 59 do not have to be respectively formed in the support substrate 10 and the ground layer 50. Alternatively, depending on the set impedance, one first opening 19 and one second opening 59 may be formed in the support substrate 10 and the ground layer 50, respectively.

As shown in FIG. 3, each first opening 19 and each second opening 59 overlapping with each other are formed such that, in the case where the suspension board 1 is viewed in the substrate stacking direction, an inner edge of the first opening 19 surrounds an inner edge of the second opening 59. In this case, as shown in FIG. 5, in a direction orthogonal to a direction in which each of the write wiring traces W1, W2 extends, a dimension d4 of each second opening 59 of the ground layer 50 is smaller than a dimension d3 of the corresponding first opening 19 of the support substrate 10. Further, as shown in FIG. 6, in a direction in parallel to a direction in which the write wiring traces W1, W2 extend, a dimension d6 of each second opening 59 of the ground layer 50 is smaller than a dimension d5 of the corresponding first opening 19 of the support substrate 10.

In this configuration, electromagnetic waves radiated from the write wiring traces W1, W2 towards the support substrate 10 can be inhibited from reaching the support substrate 10 while the first opening 19 and the second opening 59 are respectively provided in the support substrate 10 and the ground layer 50. Therefore, a loss of an electric signal transmitted through each of the write wiring traces W1, W2 in a high frequency band can be reduced while a value of the characteristic impedance of each of the write wiring trace W1, W2 is adjusted to a desired value.

(3) Intersection Region

Figure 7:
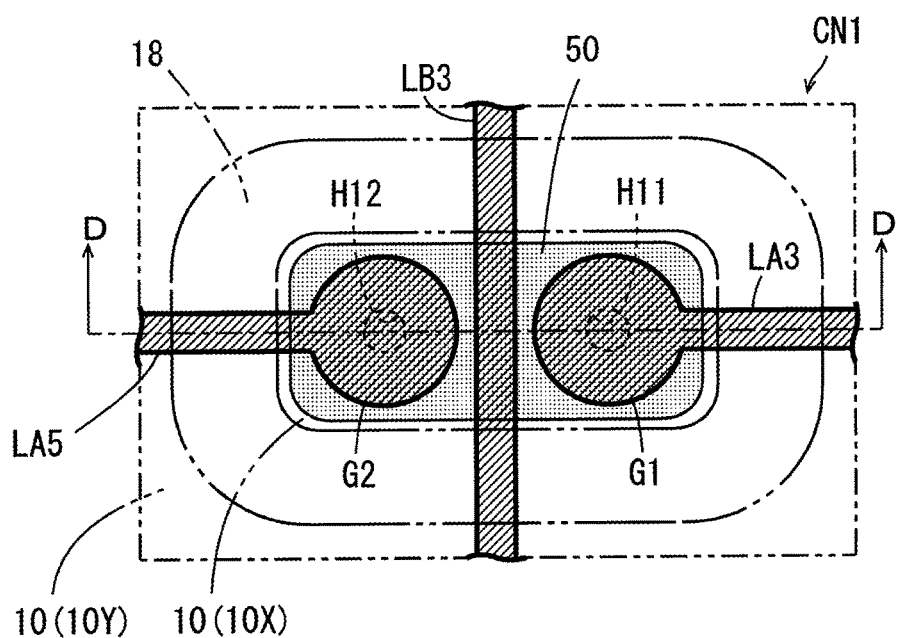
FIG. 7 is an enlarged plan view of an intersection region of FIG. 2.
Figure 8:
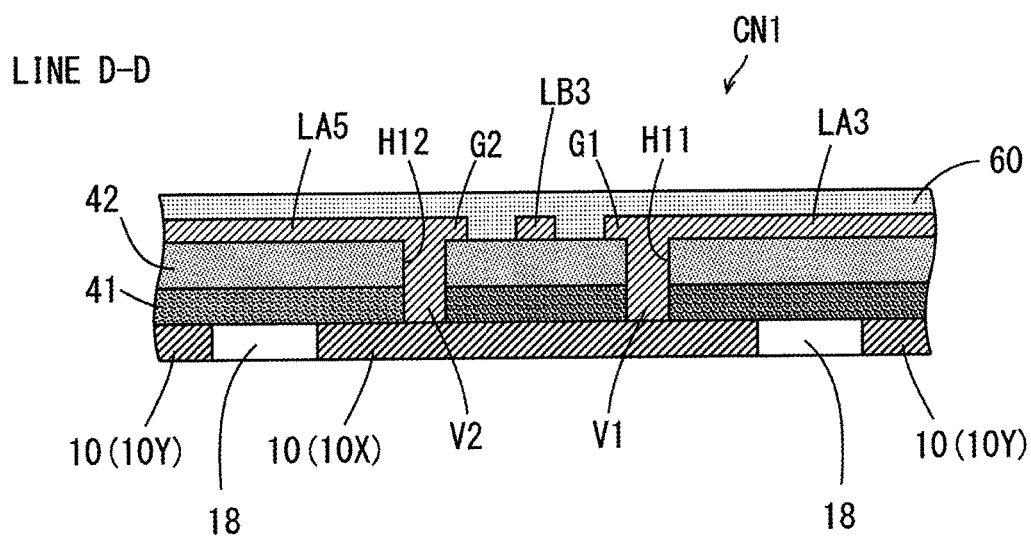
FIG. 8 is a cross sectional view taken along the line D-D of FIG. 7.

FIG. 7 is an enlarged plan view of the intersection region CN1 of FIG. 2. FIG. 8 is a cross sectional view taken along the line D-D of FIG. 7. In FIG. 7, the first insulating layer 41, the second insulating layer 42 and the third insulating layer 60 of FIG. 4 are not shown. Further, in FIG. 7, the lines LA3, LA5 of the write wiring trace W1 (FIG. 2) and the line LB3 of the write wiring trace W2 (FIG. 2) are indicated by thick solid lines and hatching. Further, the ground layer 50 is indicated by a solid line and a dotted pattern. Further, the support substrate 10 is indicated by a two-dots and dash line. The intersection region CN2 of FIG. 2 has the configuration similar to that of the intersection region CN1.

As shown in FIGS. 7 and 8, an annular opening 18 is formed in a portion, in which the intersection region CN1 is formed, of the support substrate 10. Thus, an insular portion electrically separated from other portions is formed in part of the support substrate 10. In the following description, an insular portion of the support substrate 10 is referred to as a wiring portion 10X, and a portion, except for the wiring portion 10X, of the support substrate 10 is referred to as a support portion 10Y. The wiring portion 10X and the support portion 10Y are electrically separated from each other by the annular opening 18.

The line LB3 of the write wiring trace W2 is arranged to extend and pass through a position above the wiring portion 10X, and the other end of the line LA3 and the one end of the line LA5 of the write wiring trace W1 are arranged on both sides of the line LB3.

Circular connection portions G1, G2 are provided at the other end of the line LA3 and the one end of the line LA5, respectively. Further, a through hole H11 is formed in portions of the first insulating layer 41 and the second insulating layer 42 below the connection portion G1, and a through hole H12 is formed in portions of the first insulating layer 41 and the second insulating layer 42 below the connection portion G2.

The connection portion G1 is in contact with the wiring portion 10X in the through hole H11. The connection portion G2 is in contact with the wiring portion 10X in the through hole H12. A via V1 is formed of a portion of the connection portion G1 in the through hole H11, and a via V2 is formed of a portion of the connection portion G2 in the through hole H12. Thus, the lines LA3, LA5 are electrically connected to each other through the vias V1, V2 and the wiring portion 10X.

The shape of the connection portions G1, G2 is not limited to a circle and may be another shape such as an oval, a triangular, a square, a form of a sector or the like. Further, the transverse cross sectional shape of each of the through holes H11, H12 may be another shape such as an oval, a triangular, a square, a shape of a sector or the like.

In this manner, in the present embodiment, the line LA3 and the line LA5 are electrically connected to each other through the vias V1, V2 and the wiring portion 10X in the intersection region CN1. Further, the line LB3 (FIG. 2) and the line LB5 (FIG. 2) are electrically connected to each other through the vias V1, V2 and the wiring portion 10X in the intersection region CN2 (FIG. 2).

Thus, the lines LA4, LA5 of the write wiring trace W1 of FIG. 2 and the lines LB3, LB4 of the write wiring trace W2 of FIG. 2 can be arranged without the interference between the write wiring trace W1 and the write wiring trace W2 such that the line LA5 is located between the lines LB3, LB4.

In the above-mentioned configuration, three side surfaces among one side surface and another side surface of the line LA4 and one side surface and another side surface of the line LA5 face three side surfaces among one side surface and another side surface of the line LB3 and one side surface and another side surface of the line LB4. This increases an area in which the write wiring traces W1, W2 are opposite to each other, thus increasing the capacitance of each of the write wiring traces W1, W2. This results in reduced characteristic impedance of each of the write wiring traces W1, W2.

Each of the read wiring traces R1, R2 of FIG. 1 is formed of one line, for example, on the second insulating layer 42 of FIG. 4. Alternatively, similarly to the above-mentioned configuration of each of the write wiring traces W1, W2, each of the read wiring traces R1, R2 may be formed of a plurality of lines configured to allow an electric signal to branch therein and be transmitted therethrough.

(4) Method of Manufacturing Suspension Board

The method of manufacturing the suspension board 1 will be described. FIGS. 9A to 15C are schematic cross sectional views showing the steps in the method of manufacturing the suspension board 1 of FIG. 1. In diagrams of FIGS. 9A to 15C, each of FIGS. 9A, 10A, 11A, 12A, 13A, 14A and 15A corresponds to the cross sectional view taken along the line A-A of FIG. 3, each of FIGS. 9B, 10B, 11B, 12B, 13B, 14B and 15B corresponds to the cross sectional view taken along the line B-B of FIG. 3, and each of FIGS. 9C, 10C, 11C, 12C, 13C, 14C and 15C corresponds to the cross sectional view taken along the line D-D of FIG. 7. Here, the steps of forming the tongue 12, the plurality of connection terminals 21 to 26, 31 to 36, the plurality of holes H, the read wiring traces R1, R2 and the power wiring trace P2 of FIG. 1 are not described.

Figure 9A:
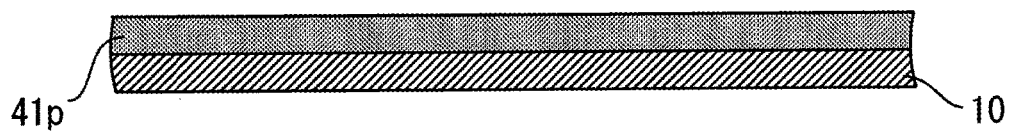
FIGS. 9A to 9C are schematic cross sectional views showing steps of a method of manufacturing the suspension board of FIG. 1.
Figure 9B:
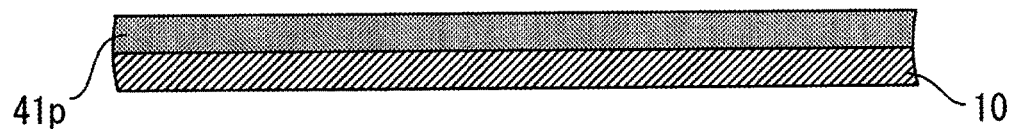
Figure 9C:
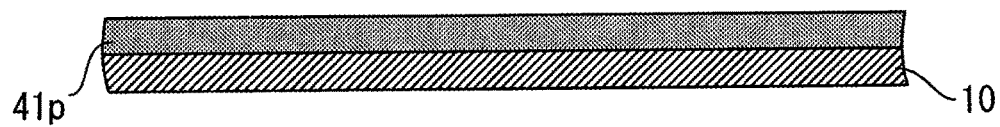

First, as shown in FIGS. 9A to 9C, a photosensitive polyimide resin precursor 41p, for example, is applied onto the elongated support substrate 10 made of stainless steel, for example. The thickness of the support substrate 10 is not less than 8 μm and not more than 100 μm, for example.

Figure 10A:
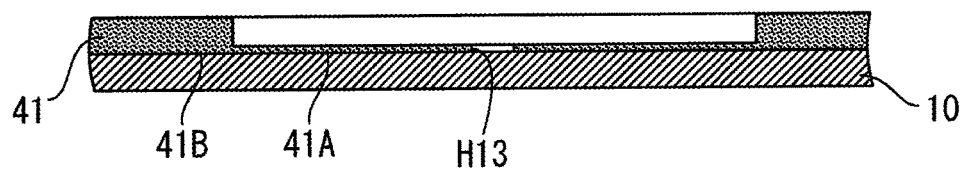
FIGS. 10A to 10C are schematic cross sectional views showing steps of the method of manufacturing the suspension board of FIG. 1.
Figure 10B:
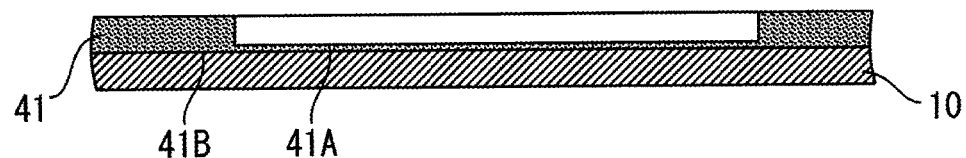
Figure 10C:
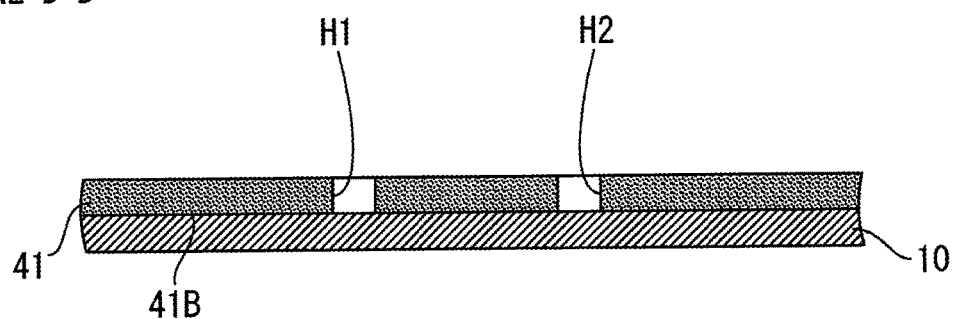

Next, as shown in FIGS. 10A to 10C, the photosensitive polyimide resin precursor 41p on the support substrate 10 is irradiated with ultraviolet rays in an exposure device through a mask having predetermined gradation. Thus, the first insulating layer 41 made of polyimide is formed. The thickness of the thick portion 41B is not less than 1 μm and not more than 25 μm, for example. The thickness of the thin portion 41A is slightly smaller than that of the thick portion 41B.

Further, as shown in FIG. 10A, the through hole H13 is formed in a portion, on which the ground layer 50 is to be formed, of the thin portion 41A of the first insulating layer 41. Thus, a portion of the support substrate 10 is exposed to a space above the first insulating layer 41 through the through hole H13. Further, as shown in FIG. 10C, two through holes H1, H2 arranged to be spaced apart from each other are formed in portions, which are to constitute the intersection region CN1 of FIG. 2, of the thick portion 41B of the first insulating layer 41. Thus, two portions on the upper surface of the support substrate 10 are exposed to a space above the first insulating layer 41 through the two through holes H1, H2.

Figure 11A:
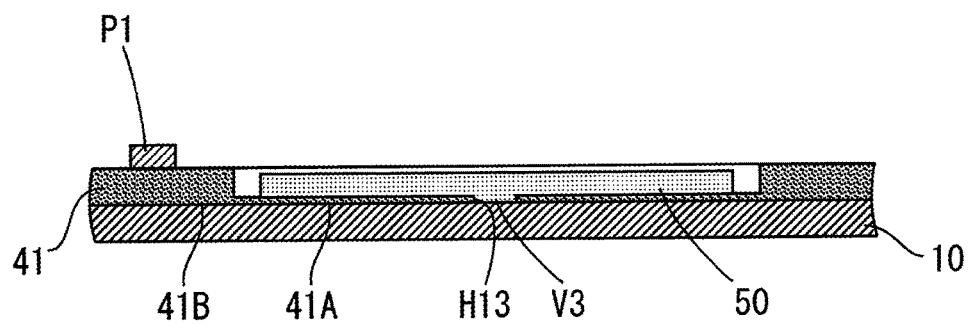
FIGS. 11A to 11C are schematic cross sectional views showing steps of the method of manufacturing the suspension board of FIG. 1.
Figure 11B:
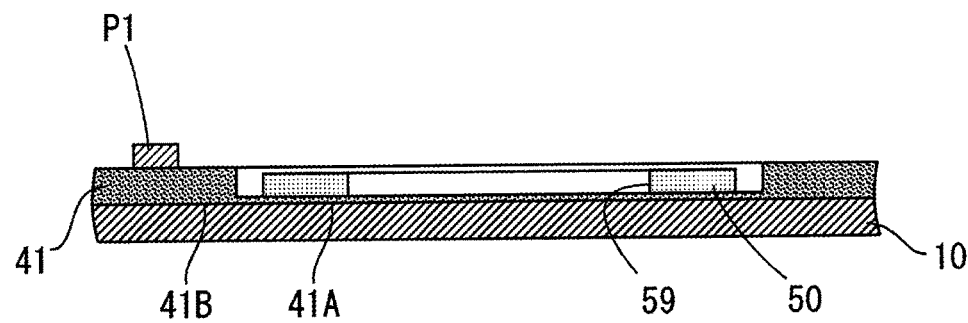
Figure 11C:
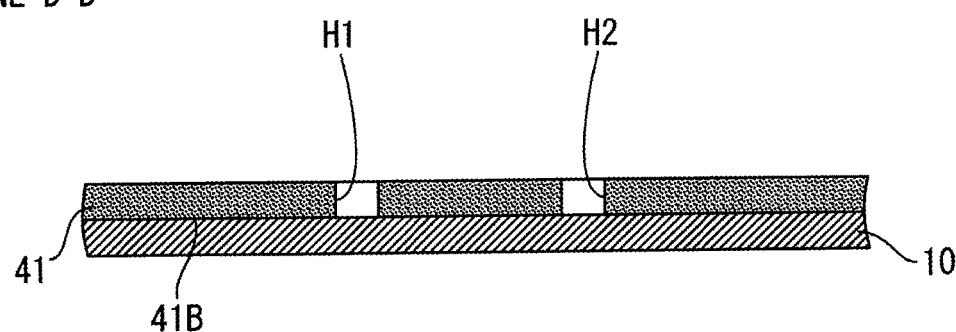

Then, as shown in FIGS. 11A to 11C, the ground layer 50 made of copper is formed on the thin portion 41A of the first insulating layer 41. Further, simultaneously with the formation of the ground layer 50, the power wiring trace P1 made of copper is formed on the thick portion 41B of the first insulating layer 41. At this time, as shown in FIG. 11B, the plurality of second openings 59 of FIG. 3 are formed in the ground layer 50. The thickness of each of the ground layer 50 and the power wiring trace P1 is not less than 1 µm and not more than 20 µm, for example. Further, as shown in FIG. 11A, when the ground layer 50 is formed, the through hole H13 is filled with copper. Thus, the via V3 is formed.

Figure 12A:
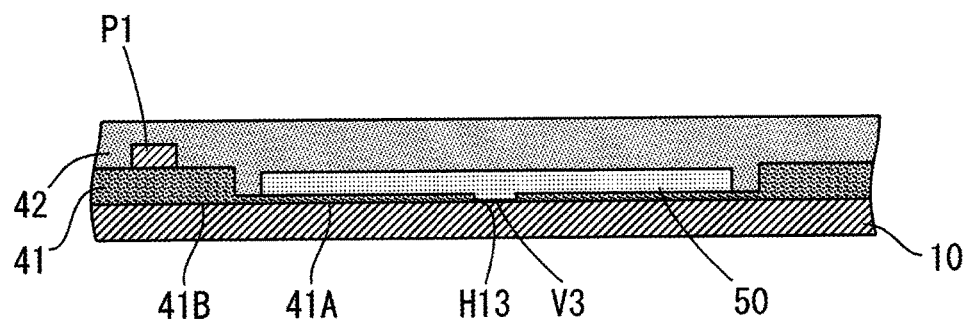
FIGS. 12A to 12C are schematic cross sectional views showing steps of the method of manufacturing the suspension board of FIG. 1.
Figure 12B:
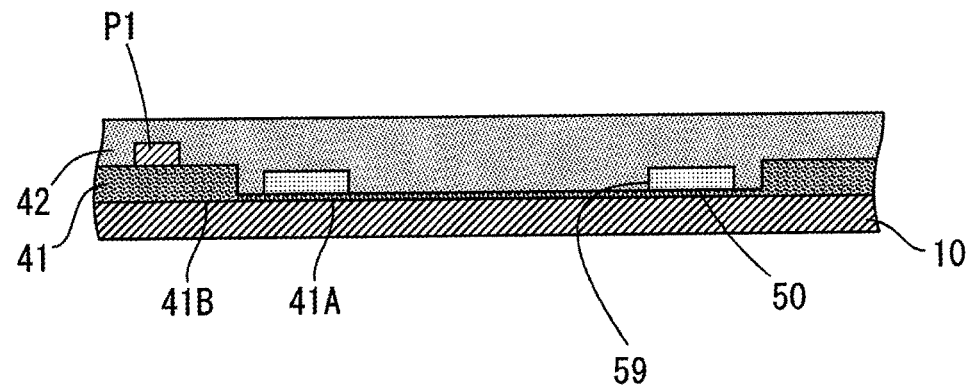
Figure 12C:
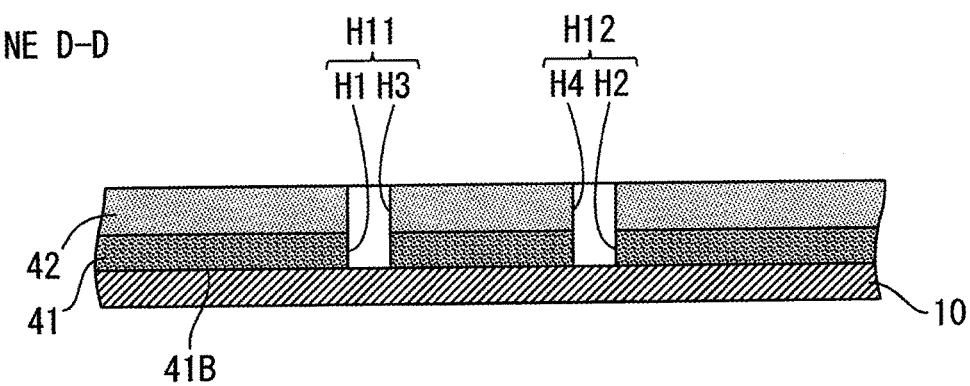

Next, as shown in FIGS. 12A to 12C, the second insulating layer 42 made of polyimide is formed on the first insulating layer 41 to cover the ground layer 50 and the power wiring trace P1. At this time, the second insulating layer 42 is formed to be in contact with the ground layer 50. The thickness of the second insulating layer 42 is not less than 1 µm and not more than 25 µm, for example.

Further, as shown in FIG. 12C, through holes H3, H4 are formed in portions of the second insulating layer 42 to respectively overlap with the two through holes H1, H2 of the first insulating layer 41. The through hole H1 and the through hole H3 are connected to each other, thereby forming a through hole H11. The through hole H2 and the through hole H4 are connected to each other, thereby forming a through hole H12.

Figure 13A:
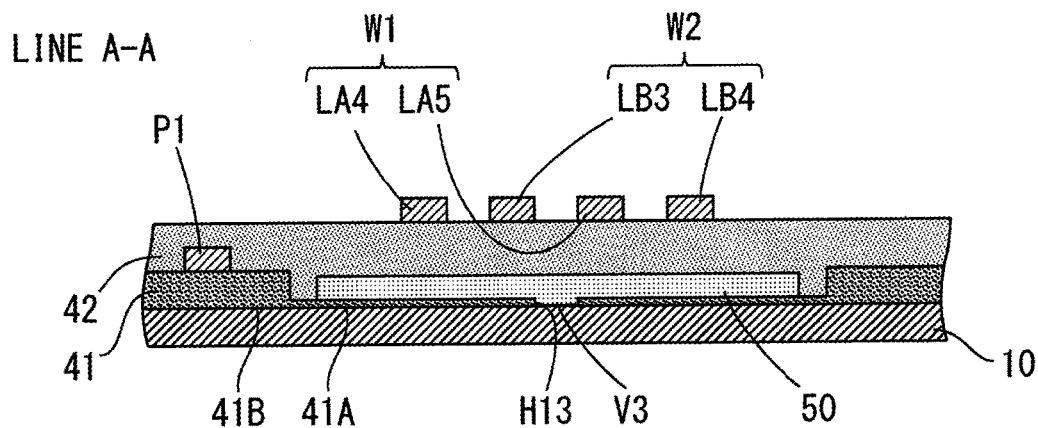
FIGS. 13A to 13C are schematic cross sectional views showing steps of the method of manufacturing the suspension board of FIG. 1.
Figure 13B:
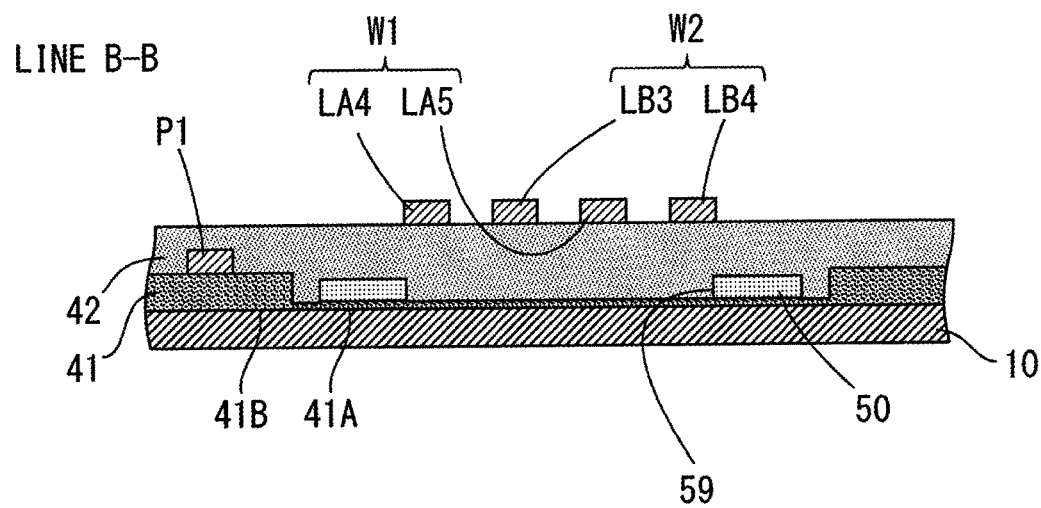
Figure 13C:
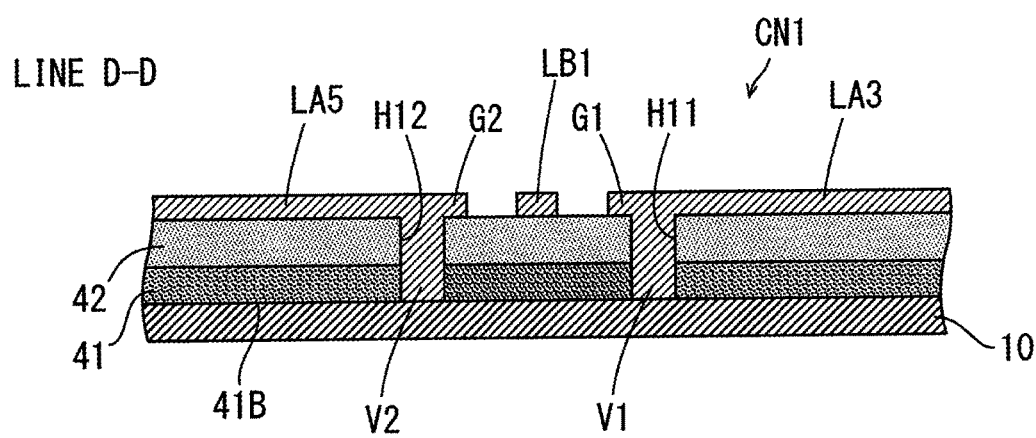

Then, as shown in FIGS. 13A to 13C, at least part of each of the write wiring traces W1, W2 made of copper is formed on the second insulating layer 42 to overlap with the ground layer 50. In the present example, as shown in FIG. 13A, parts of the lines LA4, LA5, LB3, LB4 of the write wiring traces W1, W2 are located above the ground layer 50. Further, as shown in FIG. 13B, other parts of the lines LA4, LA5, LB3, LB4 are located above the plurality of second openings 59 formed in the ground layer 50. Further, as shown in FIG. 13C, the connection portion G1 is located at the other end of the line LA3 of the write wiring trace W1, and the connection portion G2 is located at the one end of the line LA5 of the write wiring trace W1. When the lines LA3, LA5 are formed, the two through holes H11, H12 are filled with copper. Thus, the vias V1, V2 are formed.

The thickness of each of the write wiring traces W1, W2 is not less than 1 µm and not more than 20 µm, for example. The width of each of the lines LA1 to LA5 and the lines LB1 to LB5 that constitute the write wiring traces W1, W2 is not less than 6 µm and not more than 100 µm, for example. Further, a distance between a set of two lines, adjacent to each other, among the lines LA4, LB3, LA5, LB4 is not less than 6 µm and not more than 100 µm, for example. An outer diameter of each of the vias V1, V2 is not less than 15 µm and not more than 150 µm, for example.

Figure 14A:
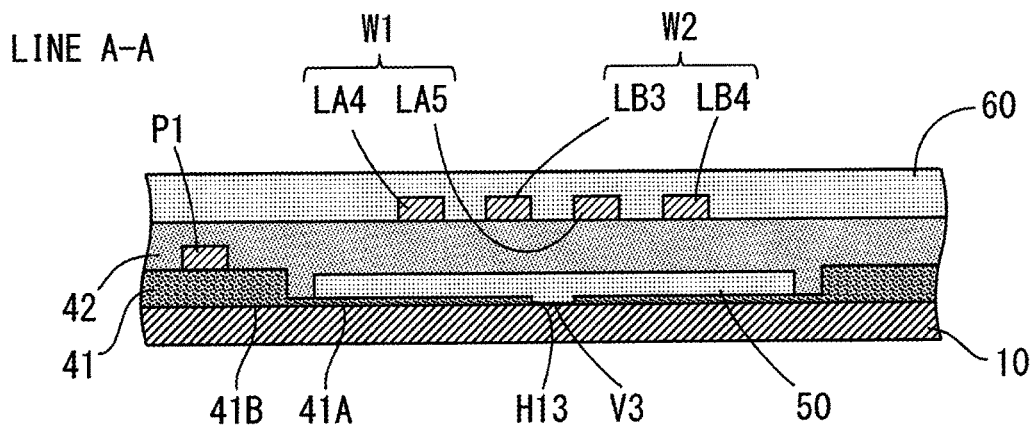
FIGS. 14A to 14C are schematic cross sectional views showing steps of the method of manufacturing the suspension board of FIG. 1.
Figure 14B:
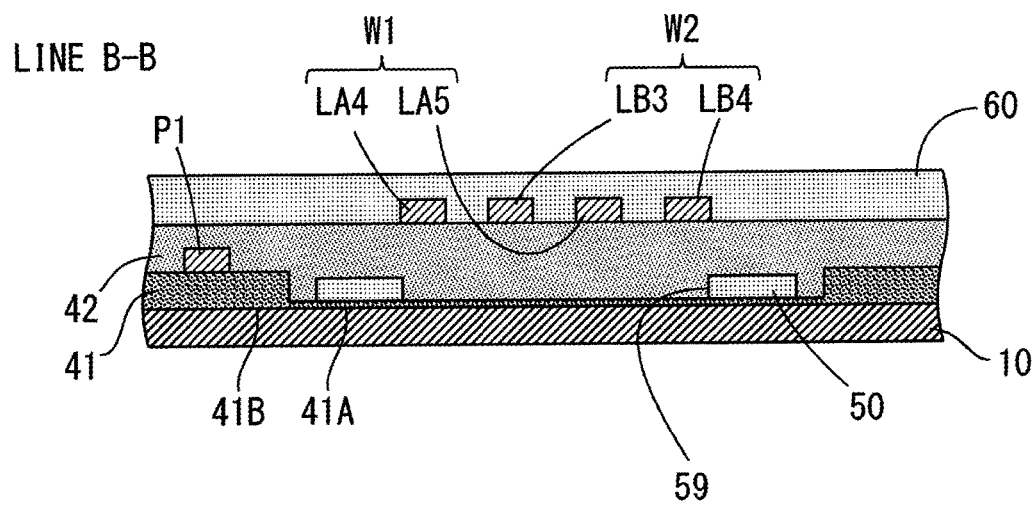
Figure 14C:
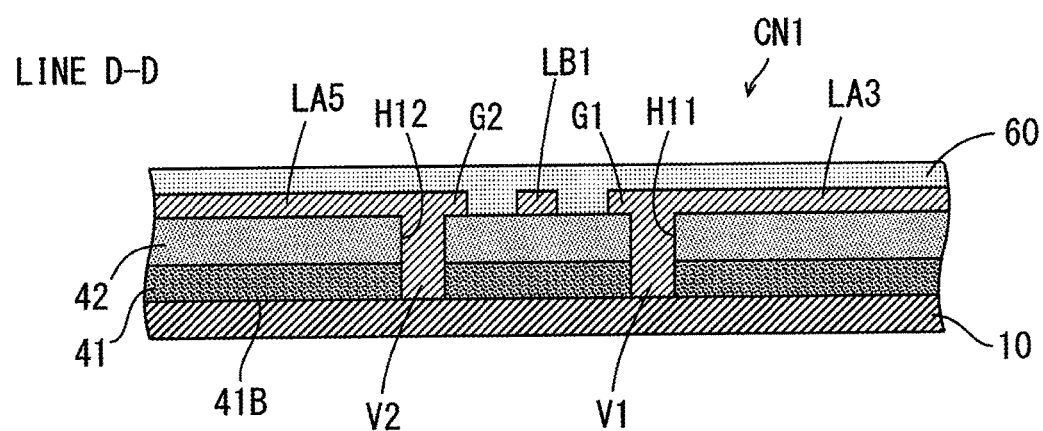

Then, as shown in FIG. 14A to 14C, the third insulating layer 60 made of polyimide is formed on the second insulating layer 42 to cover the write wiring traces W1, W2. The third insulating layer 60 is used to protect the write wiring traces W1, W2. The thickness of the third insulating layer 60 is not less than 2 µm and not more than 25 µm, for example.

Figure 15A:
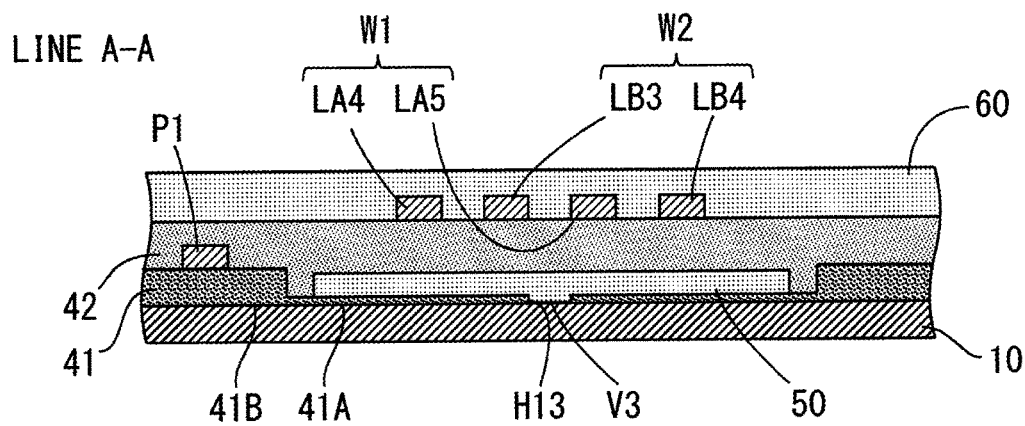
FIGS. 15A to 15C are schematic cross sectional views showing steps of the method of manufacturing the suspension board of FIG. 1.
Figure 15B:
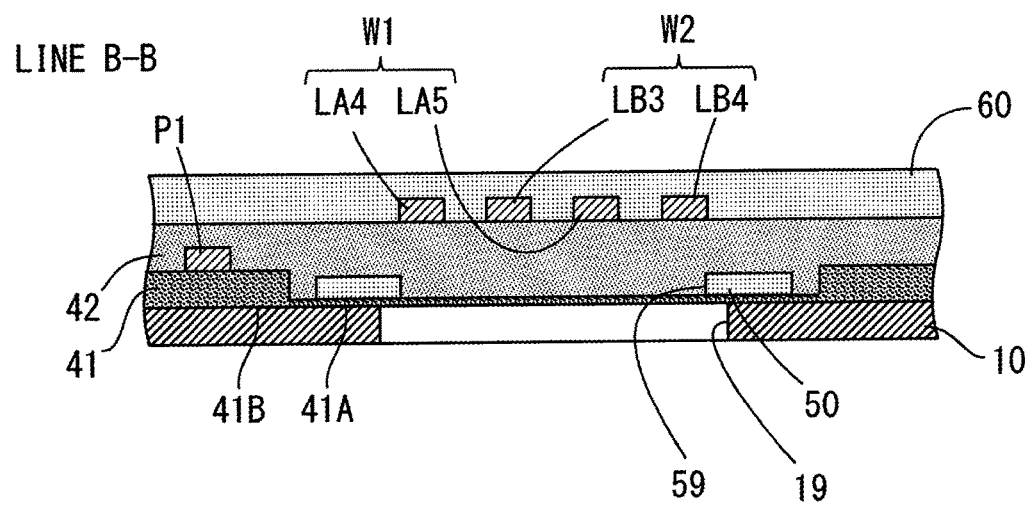
Figure 15C:
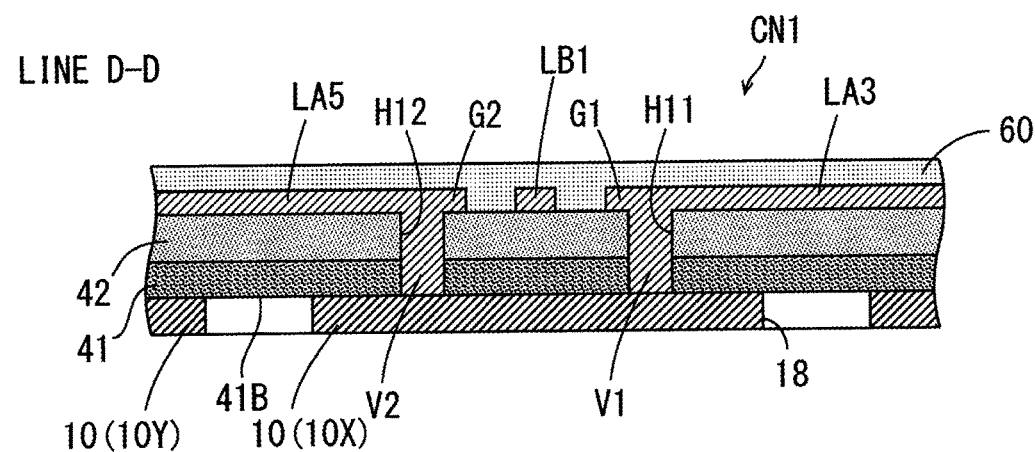

Finally, as shown in FIG. 15A to 15C, an outer edge of the support substrate 10 is formed according to a design dimension, and the plurality of first openings 19 and the annular opening 18 are formed in the support substrate 10. The plurality of first openings 19 respectively surround the plurality of second openings 59. The annular opening 18 surrounds portions of the support substrate 10 that are in contact with the vias V1, V2. Thus, the suspension board 1 is completed.

In the suspension board 1 according to the present embodiment, the first insulating layer 41 is formed on the support substrate 10. The ground layer 50 is formed on the thin portion 41A of the first insulating layer 41, and the power wiring trace P1 is formed on the thick portion 41B of the first insulating layer 41. Further, the second insulating layer 42 is formed on the first insulating layer 41 to cover the ground layer 50 and the power wiring trace P1. Further, the write wiring traces W1, W2 are formed on the second insulating layer 42 to at least partially overlap with the ground layer 50. In this case, an electric signal can be transmitted through each of the power wiring trace P1 and the write wiring traces W1, W2.

In the above-mentioned configuration, the ground layer 50 is located between at least part of each of the write wiring traces W1, W2 and the support substrate 10, so that electromagnetic waves radiated from the write wiring traces W1, W2 towards the support substrate 10 at least partially enter the ground layer 50 and do not reach the support substrate 10. Further, in the above-mentioned configuration, the distance d1 between the ground layer 50 and each of the write wiring traces W1, W2 in the substrate stacking direction is set larger than the distance d2 between the power wiring trace P1 and the write wiring trace W1. In this case, an eddy current generated in the ground layer 50 is small as compared to the case where the ground layer 50 is formed on the thick portion 41B of the first insulating layer 41. As a result, a loss of an electric signal transmitted through each of the write wiring traces W1, W2 in a high frequency band is reduced.

In the above-mentioned example, the support substrate 10 made of stainless steel is used. In this case, in the support substrate 10, sufficient rigidity required to support the write wiring traces W1, W2, the read wiring traces R1, R2 and the power wiring traces P1, P2 can be ensured by stainless steel. Further, a passive film is formed on a surface of stainless steel. Thus, deterioration of the support substrate 10 due to corrosion is inhibited.

[2] Second Embodiment

Figure 16:
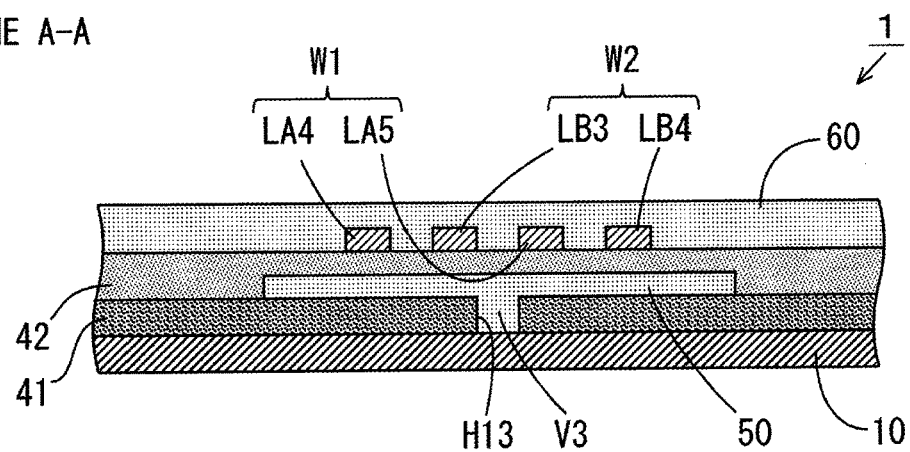
FIG. 16 is a partially enlarged plan view of a suspension board according to a second embodiment.
Figure 17:
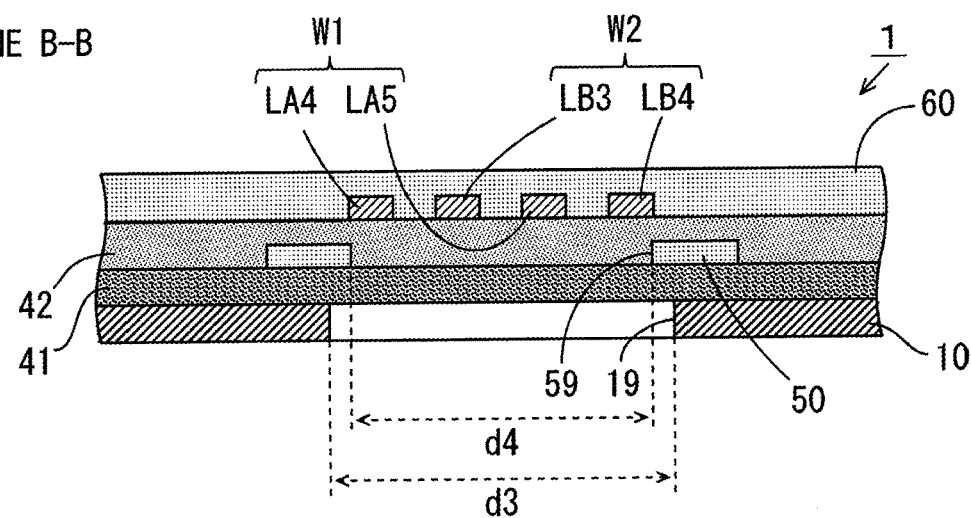
FIG. 17 is a partially enlarged plan view of the suspension board according to the second embodiment.
Figure 18:
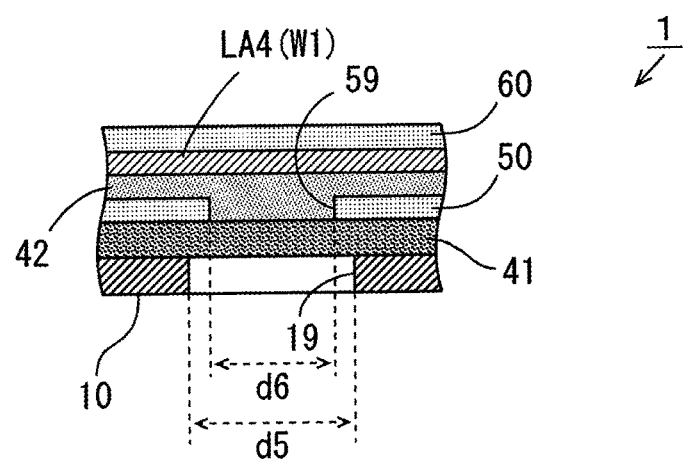
FIG. 18 is a partially enlarged plan view of the suspension board according to the second embodiment.

As for a suspension board according to the second embodiment, differences from the suspension board 1 according to the first embodiment will be described. FIGS. 16, 17 and 18 are partially enlarged plan views of the suspension board according to the second embodiment. FIGS. 16, 17 and 18 correspond to the cross sectional view taken along the line A-A, the cross sectional view taken along the line B-B, and the cross sectional view taken along the line C-C of FIG. 3, respectively.

As shown in FIGS. 16 and 17, in the suspension board 1 according to the present embodiment, power wiring traces P1, P2 are not formed on a first insulating layer 41. As shown in FIGS. 16 to 18, the first insulating layer 41 does not have a thin portion 41A or a thick portion 41B, and is formed to have a uniform thickness.

Similarly to the first embodiment, an area in which write wiring traces W1, W2 overlap with a support substrate 10 and a ground layer 50 is adjusted such that a value of characteristic impedance of each of the write wiring traces W1, W2 is close to a desired value. Specifically, a plurality of first openings 19 overlapping with the write wiring traces W1, W2 are formed in the support substrate 10. Further, a plurality of second openings 59 that respectively overlap with the plurality of first openings 19 are formed in the ground layer 50. In the case where the suspension board 1 is viewed in a substrate stacking direction, an inner edge of each first opening 19 surrounds an inner edge of each second opening 59.

In this case, as shown in FIG. 17, in a direction orthogonal to a direction in which the write wiring traces W1, W2 extend, a dimension d4 of each second opening 59 of the ground layer 50 is smaller than a dimension d3 of the corresponding first opening 19 of the support substrate 10.

Further, as shown in FIG. 18, in a direction parallel to a direction in which the write wiring traces W1, W2 extend, a dimension d6 of each second opening 59 of the ground layer 50 is smaller than a dimension d5 of the corresponding first opening 19 of the support substrate 10.

In the above-mentioned configuration, because the ground layer 50 is located between at least part of each of the write wiring traces W1, W2 and the support substrate 10, electromagnetic waves radiated from each of the write wiring traces W1, W2 towards the support substrate 10 at least partially enter the ground layer 50 and do not reach the support substrate 10. Further, it is possible to easily adjust a value of characteristic impedance of the write wiring traces W1, W2 by adjusting the sizes and the numbers of the first openings 19 and the second openings 59.

A dimension of each second opening 59 of the ground layer 50 is set such that the ground layer 50 is partially present between each of the write wiring traces W1, W2 and the support substrate 10. Therefore, electromagnetic waves radiated from each of the write wiring traces W1, W2 towards the support substrate 10 can be inhibited from reaching the support substrate 10 while the first openings 19 and the second openings 59 are respectively provided in the support substrate 10 and the ground layer 50. Thus, a loss of an electric signal transmitted through each of the write wiring trace W1, W2 in a high frequency band can be reduced while a value of the characteristic impedance of each of the write wiring traces W1, W2 is adjusted to a desired value.

A method of manufacturing the suspension board 1 according to the present embodiment is similar to the method of manufacturing the suspension board 1 according to the first embodiment except for the following points. In the steps of FIGS. 10A to 10C, a photosensitive polyimide resin precursor 41p on the support substrate 10 is irradiated with ultraviolet rays through a mask not having gradation. Further, in the steps of FIGS. 11A to 11C, the power wiring traces P1, P2 are not formed on the first insulating layer 41.

Figure 19:
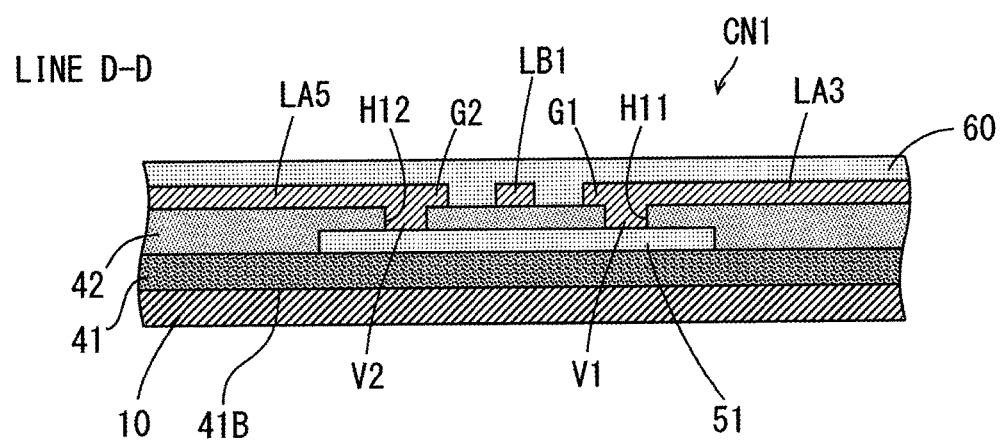
FIG. 19 is a cross sectional view of a portion corresponding to the line D-D of FIG. 7 of a suspension board according to another embodiment.

[3] Other Embodiments (1) While the line LA3 and the line LA5 are electrically connected to each other through the wiring portion 10X of the support substrate 10 in the above-mentioned embodiment, the present invention is not limited to this. FIG. 19 is a cross sectional view of a portion, corresponding to the line D-D of FIG. 7, of a suspension board according to another embodiment.

As shown in FIG. 19, the suspension board 1 according to the present embodiment further includes a relay trace 51 arranged on a thick portion 41B of a first insulating layer 41 to overlap with connection portions G1, G2. The relay trace 51 can be formed of the same material as that of the write wiring traces W1, W2 of FIG. 1 and the like simultaneously with formation of the write wiring traces W1, W2.

Through holes H11, H12 are respectively formed in portions of the second insulating layer 42 below the connection portions G1, G2. The connection portion G1 is in contact with the relay trace 51 in the through hole H11, and the connection portion G2 is in contact with the relay trace 51 in the through holes H12. A via V1 is formed of a portion of the connection portion G1 in the through hole H11, and a via V2 is formed of a portion of the connection portion G2 in the through hole H12. Thus, lines LA3, LA5 are electrically connected to each other through the vias V1, V2 and the relay trace 51.

In the configuration of FIG. 19, it is not necessary to use part of the support substrate 10 as a wiring portion 10X. Therefore, the annular opening 18 of FIG. 8 is not formed in the support substrate 10.

(2) While the ground layer 50 is electrically connected to the support substrate 10 through the via V3 in the above-mentioned embodiment, the present invention is not limited to this. The ground layer 50 may be electrically connected to the support substrate 10 without the via V3.

(3) While each of the power wiring traces P1, P2 is a low frequency line for allowing an electric signal having a low frequency band to be transmitted therethrough in the first embodiment, the present invention is not limited to this. In the case where a loss of an electric signal transmitted through each of the power wiring traces P1, P2 is allowed to a certain degree, an electric signal having a high frequency band may be transmitted through each of the power wiring traces P1, P2. That is, the power wiring traces P1, P2 may be used as high frequency lines.

(4) While the inner edge of each first opening 19 of the support substrate 10 surrounds the inner edge of each second opening 59 of the ground layer 50 in the first embodiment, the present invention is not limited to this. The inner edge of the first opening 19 of the support substrate 10 may overlap with the inner edge of the second opening 59 of the ground layer 50. Alternatively, the inner edge of the second opening 59 of the ground layer 50 may surround the inner edge of the first opening 19 of the support substrate 10.

(5) While the first insulating layer 41 has the thin portion 41A and the thick portion 41B in the first embodiment, the present invention is not limited to this. The first insulating layer 41 does not have to have the thin portion 41A or the thick portion 41B and may be formed to have a uniform thickness. In this case, the ground layer 50 is formed to be have a thickness smaller than that of the power wiring trace P1.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the support substrate 10 is an example of a support substrate, the first insulating layer 41 is an example of a first insulating layer and the second insulating layer 42 is an example of a second insulating layer. The third insulating layer 60 is an example of a third insulating layer, the ground layer 50 is an example of a ground layer, the power wiring trace P1 is an example of a lower wiring trace and the write wiring traces W1, W2 are examples of an upper wiring trace.

The suspension board 1 is an example of a printed circuit board, the thin portion 41A is an example of a first portion, the thick portion 41B is an example of a second portion and the first opening 19 is an example of a first opening. The second opening 59 is an example of a second opening, the via V1 is an example of a first via, the via V2 is an example of a second via, the via V3 is an example of a third via and the support portion 10Y is an example of a support portion.

The wiring portion 10X is an example of a wiring portion, the write wiring trace W1 is an example of a first signal line, the write wiring trace W2 is an example of a second signal line and the line LA4 is an example of a first branch line. The line LA5 is an example of a second branch line, the line LB3 is an example of a third branch line, the line LB4 is an example of a fourth branch line and the relay trace 51 is an example of a relay trace.

As each of constituent elements recited in the claims, various other elements having configurations or functions described in the claims can be also used.

Figure 20A:
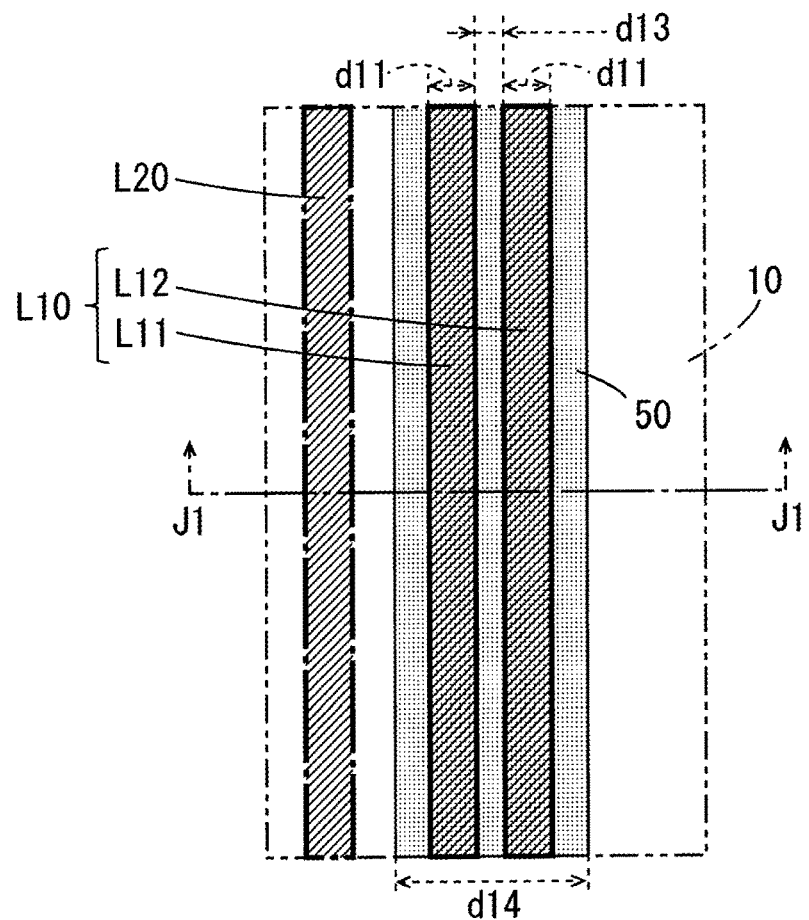
FIGS. 20A and 20B are a plan view and a cross sectional view of a suspension board according to an inventive example 1.

[5] Inventive Examples (1) Inventive Examples and Comparative Examples Relating to First Embodiment Suppose that the following suspension boards are used as the inventive examples 1, 2 and the comparative examples 1, 2 relating to the first embodiment. FIG. 20A is a plan view of the suspension board according to the inventive example 1, and FIG. 20B is a cross sectional view taken along the line J1-J1 of FIG. 20A.

As shown in FIG. 20A, in the suspension board according to the inventive example 1, an upper wiring trace L10 and a lower wiring trace L20 extending in one direction are formed to be arranged in another direction orthogonal to the one direction. The upper wiring trace L10 includes two lines L11, L12. A differential signal line pair is constituted by the lines L11, L12.

Figure 20B:
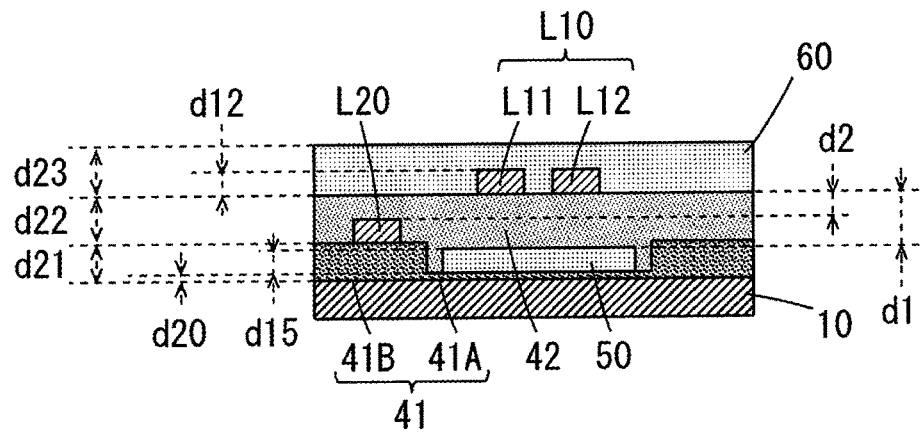

As shown in FIG. 20B, the first insulating layer 41 made of polyimide is formed on the support substrate 10 made of stainless steel. The ground layer 50 made of copper is formed on the thin portion 41A of the first insulating layer 41. The lower wiring trace L20 made of copper is formed on the thick portion 41B of the first insulating layer 41. The second insulating layer 42 made of polyimide is formed on the first insulating layer 41 to cover the ground layer 50 and the lower wiring trace L20. The upper wiring trace L10 made of copper is formed on the second insulating layer 42. The third insulating layer 60 made of polyimide is formed on the second insulating layer 42 to cover the upper wiring trace L10.

In FIG. 20A, the first insulating layer 41, the second insulating layer 42 and the third insulating layer 60 of FIG. 20B are not shown. Further, in FIG. 20A, the upper wiring trace L10 is indicated by thick solid lines and hatching, the lower wiring trace L20 is indicated by a thick one-dot and dash line and hatching, and the ground layer 50 is indicated by a solid line and a dotted pattern. Further, the support substrate 10 is indicated by a two-dots and dash line.

In the suspension board according to the inventive example 1, the length of each of the lines L11, L12 and the lower wiring trace L20 is 20 mm. A width d11 and a thickness d12 of each of the lines L11, L12 and the lower wiring trace L20 are 80 µm and 8 µm, respectively. A distance d13 between the lines L11, L12 is 20 µm. A width d14 of the ground layer 50 is 300 µm. A thickness d15 of each of the lower wiring trace L20 and the ground layer 50 is 4 µm.

A thickness d20 of the thin portion 41A and a thickness d21 of the thick portion 41B of the first insulating layer 41 are 2 µm and 8 µm, respectively. A thickness d22 of the second insulating layer 42 and a thickness d23 of the third insulating layer 60 are 8 µm and 12 µm, respectively. In the substrate stacking direction, the distance d1 between the ground layer 50 and each of the lines L11, L12 is 10 µm, and the distance d2 between the lower wiring trace L20 and each of the lines L11, L12 is 4 µm. In the suspension board according to the inventive example 1, an aperture ratio, described below, is set to 0%.

Figure 21:
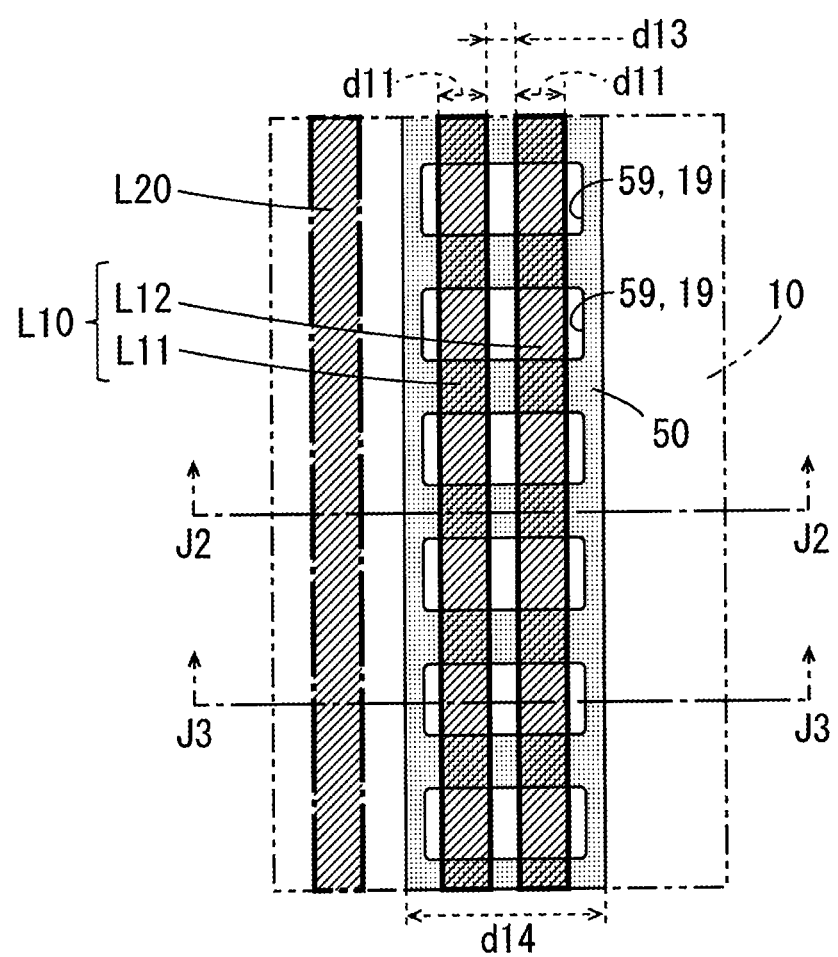
FIG. 21 is a plan view of a suspension board according to an inventive example 2.
Figure 22A:
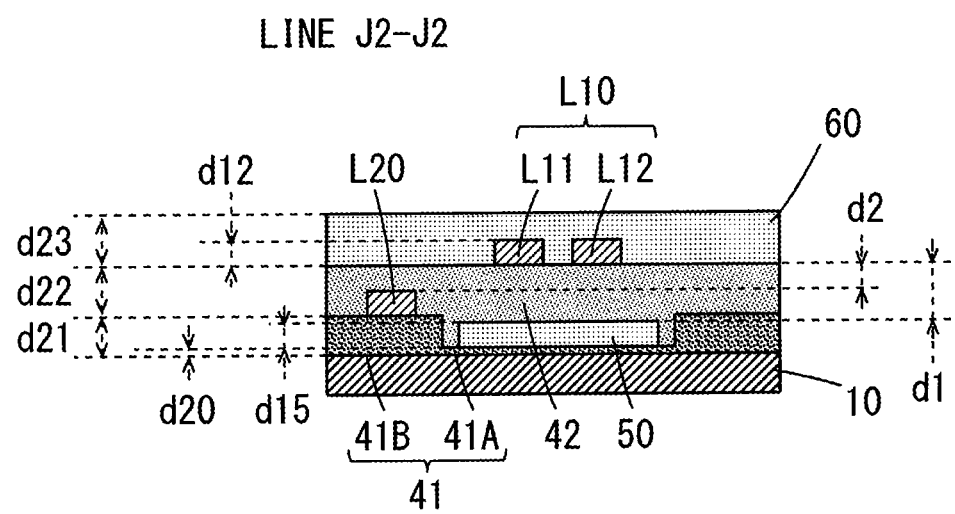
FIGS. 22A and 22B are a cross sectional view taken along the line J2-J2 and a cross sectional view taken along the line J3-J3 of FIG. 21.
Figure 22B:
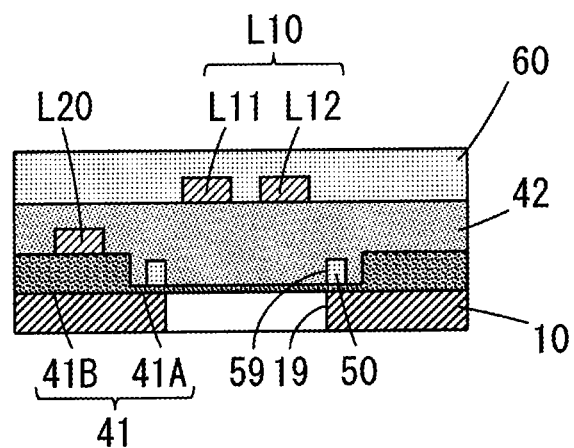

FIG. 21 is a plan view of the suspension board according to the inventive example 2. FIG. 22A is a cross sectional view taken along the line J2-J2 of FIG. 21, and FIG. 22B is a cross sectional view taken along the line J3-J3 of FIG. 21. In FIG. 21, similarly to the example of FIG. 20A, parts of a plurality of constituent elements of the suspension board are indicated by different display patterns, and other constituent elements are not shown. The suspension board according to the inventive example 2 has the same configuration as that of the suspension board according to the inventive example 1 except for the following points.

As shown in FIGS. 21, 22A, 22B, in the suspension board according to the inventive example 2, the plurality of first openings 19 are intermittently formed in portions, overlapping with the upper wiring trace L10, of the support substrate 10 to be arranged in one direction. Further, the plurality of second openings 59 overlapping with the plurality of first openings 19 are respectively formed in the ground layer 50.

Suppose that a total area in which the plurality of first openings 19 overlap with the upper wiring trace L10 is an aperture area. In this case, a ratio of the aperture area to an area (an area in which the second insulating layer 42 is in contact with the upper wiring trace L10) in which the upper wiring trace L10 is formed on the second insulating layer 42 is referred to as an aperture ratio. In the suspension board according to the inventive example 2, the aperture ratio is set to 50%.

Figure 23A:
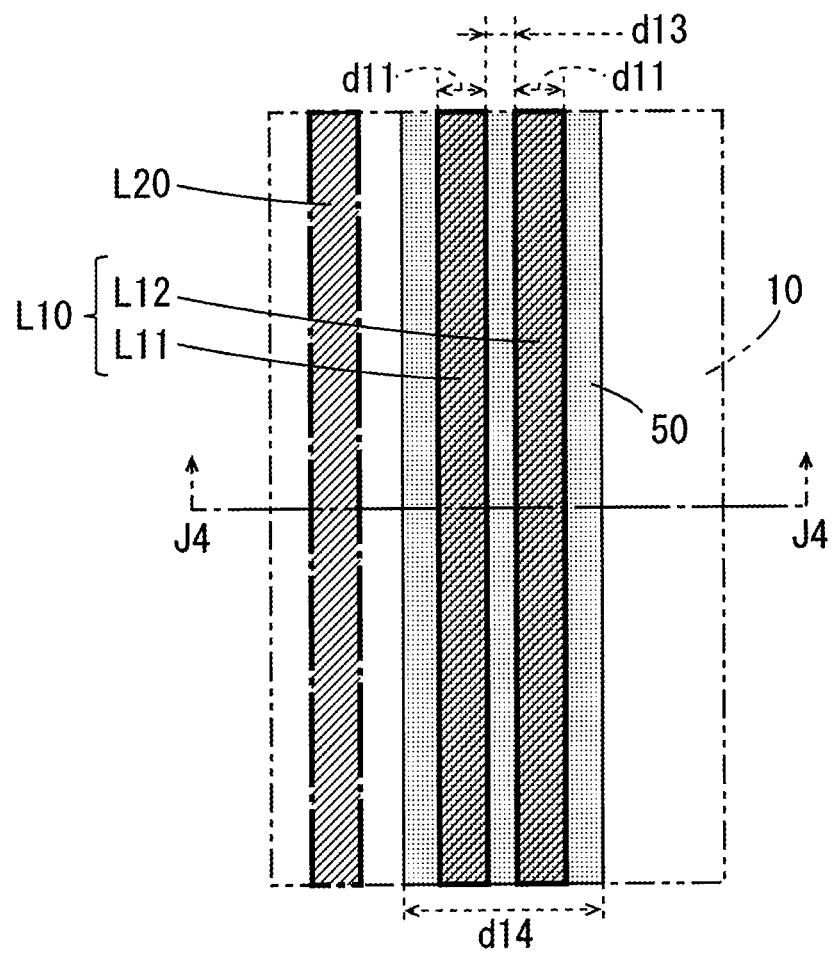
FIGS. 23A and 23B are a plan view and a cross sectional view of a suspension board according to a comparative example 1.
Figure 23B:
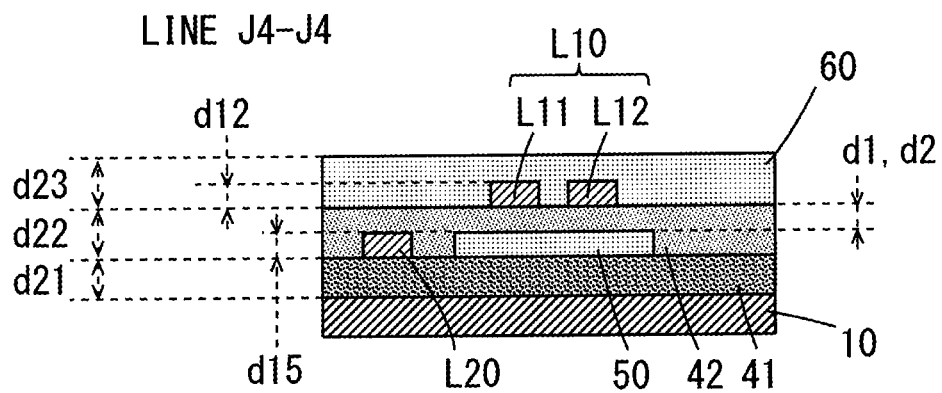

FIG. 23A is a plan view of the suspension board according to the comparative example 1, and FIG. 23B is a cross sectional view taken along the line J4-J4 of FIG. 23A. In FIG. 23A, parts of a plurality of constituent elements of the suspension board are indicated by different display patterns, and other constituent elements are not shown. The suspension board according to the comparative example 1 has the same configuration as that of the suspension board according to the inventive example 1 except for the following points.

As shown in FIGS. 23A and 23B, in the suspension board according to the comparative example 1, the first insulating layer 41 does not have the thin portion 41A or the thick portion 41B, and is formed to have a uniform thickness. The thickness d21 of the first insulating layer 41 is 8 µm. Further, the thickness d15 of the ground layer 50 is equal to the thickness of the lower wiring trace L20, and is 4 µm. Therefore, the distance d1 between the ground layer 50 and each of lines L11, L12 in the substrate stacking direction is equal to the distance d2 between the lower wiring trace L20 and each of lines L11, L12 in the substrate stacking direction, and is 4 µm. In the suspension board according to the comparative example 1, an aperture ratio is set to 0%.

Figure 24A:
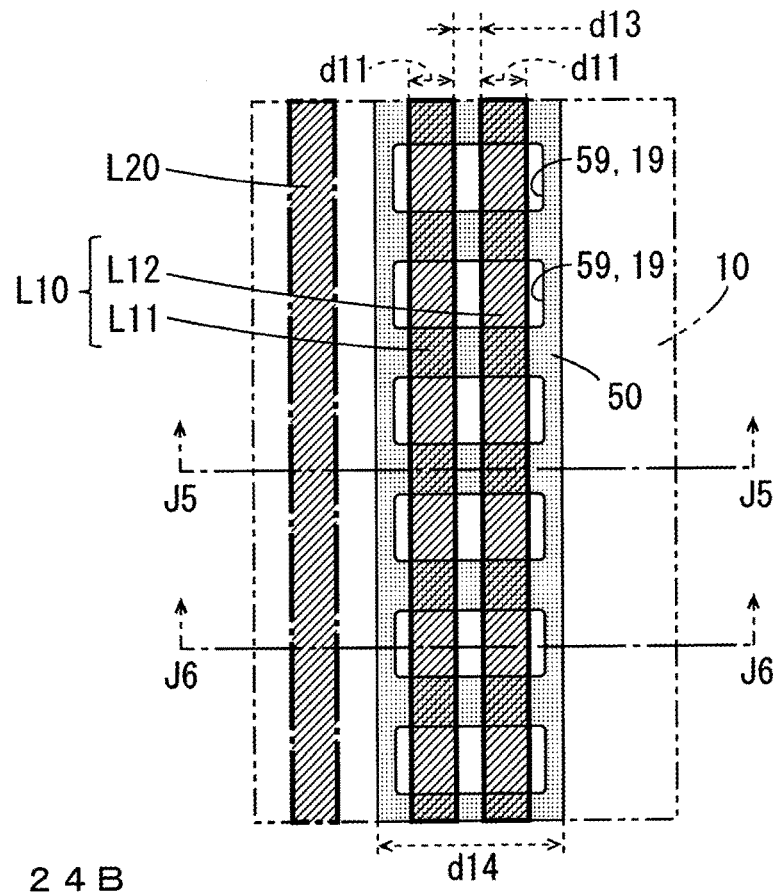
FIGS. 24A to 24C are a plan view and cross sectional views of a suspension board according to a comparative example 2.
Figure 24B:
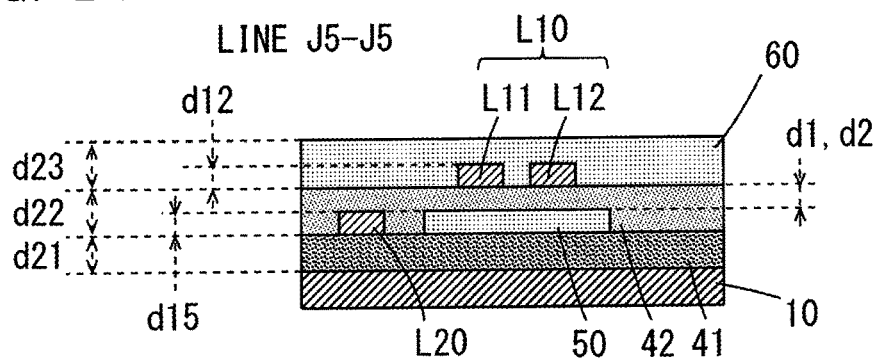
Figure 24C:
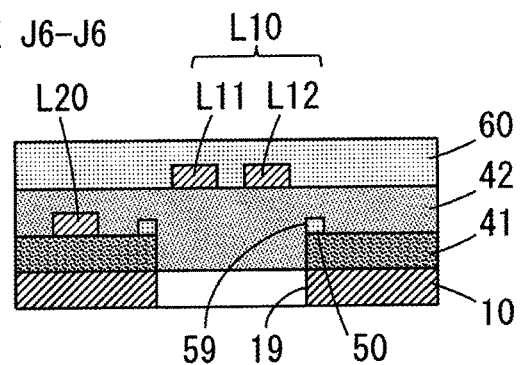

FIG. 24A is a plan view of the suspension board according to the comparative example 2, FIG. 24B is a cross sectional view taken along the line J5-J5 of FIG. 24A and FIG. 24C is a cross sectional view taken along the line J6-J6 of FIG. 24A. In FIG. 24A, similarly to the example of FIG. 20A, parts of a plurality of constituent elements of the suspension board are indicated by different display patterns, and other constituent elements are not shown. The suspension board according to the comparative example 2 has the same configuration as that of the suspension board according to the comparative example 1 except for the following points.

As shown in FIGS. 24A to 24C, in the suspension board according to the comparative example 2, similarly to the suspension board according to the inventive example 2, the plurality of first openings 19 are intermittently formed in portions, overlapping with an upper wiring trace L10, of a support substrate 10 to be arranged in one direction. Further, the plurality of second openings 59 are formed in portions, overlapping with the upper wiring trace L10, of the ground layer 50 to respectively overlap with the plurality of first openings 19. In the suspension board according to the comparative example 2, an aperture ratio is set to 50%.

The dimension of each portion of the suspension board according to each of the inventive examples 1, 2 and the comparative examples 1, 2 is shown in the below-mentioned Table 1.

TABLE 1

|  | INVENTIVE EXAMPLE 1 | INVENTIVE EXAMPLE 2 | COMPARATIVE EXAMPLE 1 | COMPARATIVE EXAMPLE 2 |
|---|---|---|---|---|
| LENGTH OF EACH OF UPPER WIRING TRACE AND LOWER WIRING TRACE | 20 mm | 20 mm | 20 mm | 20 mm |
| WIDTH OF EACH OF UPPER WIRING TRACE AND LOWER WIRING TRACE | 80 μm | 80 μm | 80 μm | 80 μm |
| THICKNESS OF UPPER WIRING TRACE | 8 μm | 8 μm | 8 μm | 8 μm |
| DISTANCE BETWEEN TWO LINES IN UPPER WIRING TRACE | 20 μm | 20 μm | 20 μm | 20 μm |
| WIDTH OF GROUND LAYER | 300 μm | 300 μm | 300 μm | 300 μm |
| THICKNESS OF EACH OF GROUND LAYER AND LOWER WIRING TRACE | 4 μm | 4 μm | 4 μm | 4 μm |
| THICKNESS OF FIRST INSULATING LAYER (THICK PORTION) | 8 μm | 8 μm | 8 μm | 8 μm |
| THICKNESS OF FIRST INSULATING LAYER (THIN PORTION) | 2 μm | 2 μm |  |  |
| THICKNESS OF SECOND INSULATING LAYER | 8 μm | 8 μm | 8 μm | 8 μm |
| THICKNESS OF THIRD INSULATING LAYER | 12 μm | 12 μm | 12 μm | 12 μm |
| APERTURE RATIO | 0% | 50% | 0% | 50% |
| DISTANCE BETWEEN GROUND LAYER AND UPPER WIRING TRACE | 10 μm | 10 μm | 4 μm | 4 μm |
| DISTANCE BETWEEN LOWER WIRING TRACE AND UPPER WIRING TRACE | 4 μm | 4 μm | 4 μm | 4 μm |

An S parameter Sdd21, which indicates the transmission characteristics when an electric signal is transmitted through the upper wiring trace L10 of the suspension board according to each of the inventive examples 1, 2 and the comparative example 1, 2 was found by simulation. The S parameter Sdd21 indicates an attenuation amount in a differential mode input and a differential mode output.

Figure 25:
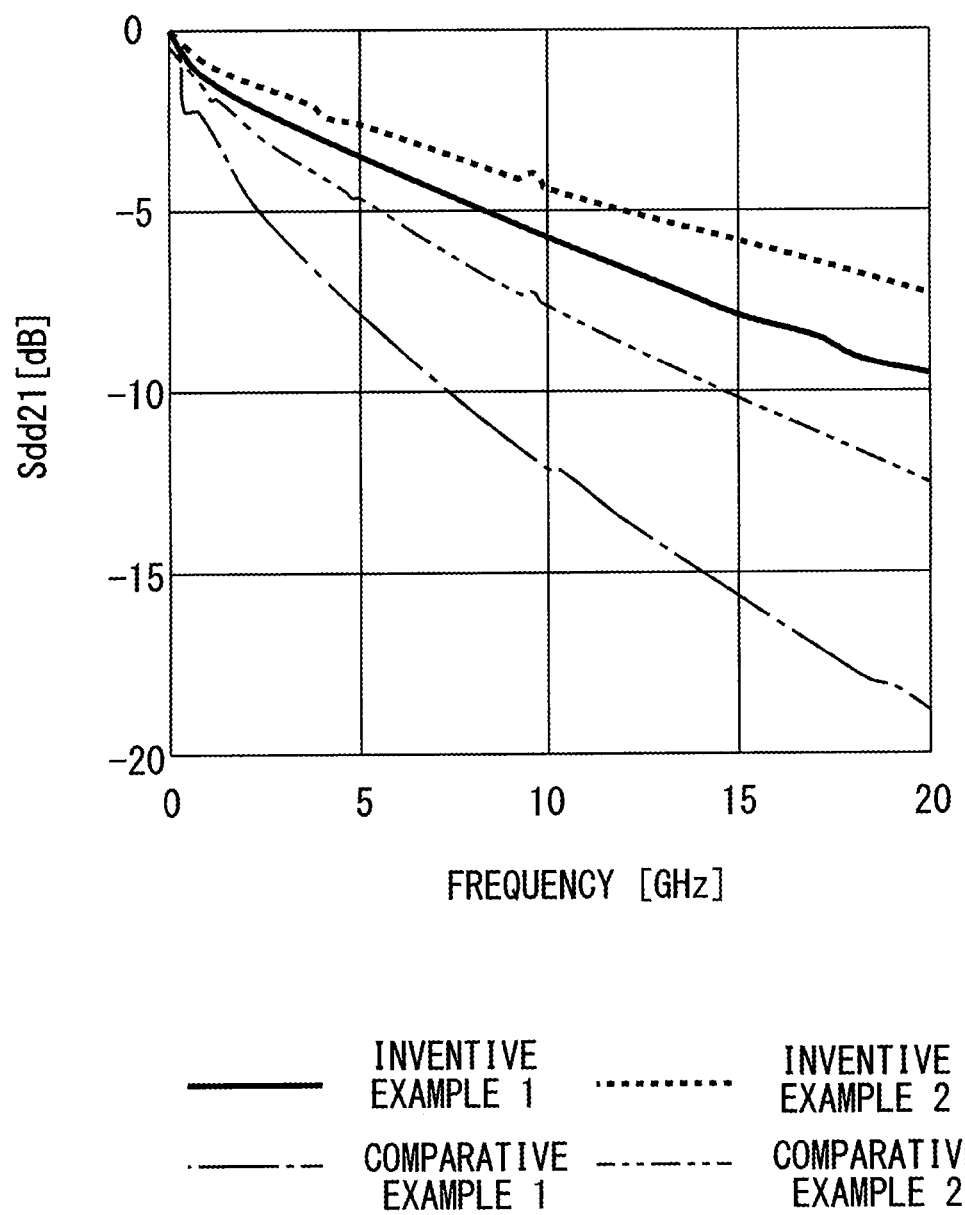
FIG. 25 is a diagram showing results of simulation relating to the suspension boards according to the inventive examples 1, 2 and the comparative examples 1, 2.

FIG. 25 is a diagram showing results of simulation relating to the suspension boards according to the inventive examples 1, 2 and the comparative examples 1, 2. In FIG. 25, the ordinate indicates the S parameter Sdd21 [dB], and the abscissa indicates a frequency [GHz] of an electric signal. Further, in FIG. 25, the results of simulation relating to the inventive examples 1, 2 are indicated by a thick solid line and a thick dotted line, respectively. The results of simulation relating to the comparative examples 1, 2 are indicated by a one-dot and dash line and a two-dots and dash line, respectively.

In FIG. 25, a negative gain indicated by the ordinate represents the loss. Therefore, it is indicated that, the lower the value of the S parameter Sdd21 is, the larger the attenuation amount is. Further, it is indicated that, the closer the value of the S parameter Sdd21 is to 0, the smaller the attenuation amount is.

According to the results of simulation of FIG. 25, in a frequency band from 0 to 20 GHz, an attenuation amount of an electric signal transmitted in the suspension board according to the inventive example 1 is smaller than an attenuation amount of an electric signal transmitted in each of the suspension boards according to the comparative examples 1, 2. Thus, it was found that it was possible to reduce the attenuation amount of the electric signal over wide frequency bands by making the distance d1 between the ground layer 50 and each of the lines L11, L12 be larger than the distance d2 between the lower wiring trace L20 and each of the lines L11, L12 in the substrate stacking direction.

Further, according to the results of simulation of FIG. 25, in the frequency band from 0 to 20 GHz, an attenuation amount of an electric signal transmitted in the suspension board according to the inventive example 2 is even smaller than the attenuation amount of the electric signal transmitted in the suspension board according to the inventive example 1. Thus, it was found that it was possible to reduce the attenuation amount of the electric signal over wide frequency bands by setting the aperture ratio to a high ratio.

(2) Inventive Example and Comparative Examples Relating to Second Embodiment

Figure 26:
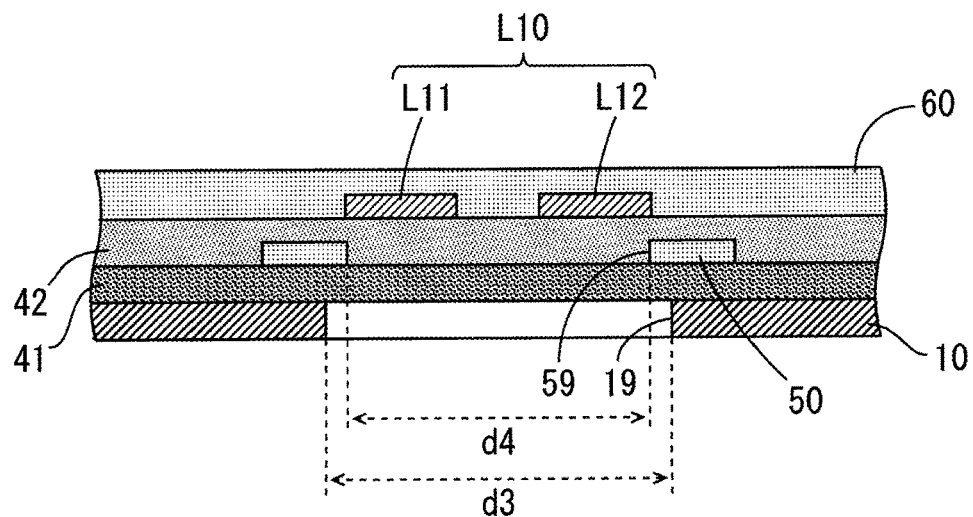
FIG. 26 is a cross sectional view of a suspension board according to an inventive example 3.

Suppose that the following suspension boards are used as the inventive example 3 and the comparative examples 3, 4 relating to the second embodiment. FIG. 26 is a cross sectional view of the suspension board according to the inventive example 3. The cross sectional view of FIG. 26 corresponds to the cross sectional view taken along the line B-B of FIG. 17. The same is true for FIGS. 27 and 28, described below.

As shown in FIG. 26, in the suspension board according to the inventive example 3, the first insulating layer 41 made of polyimide is formed on the support substrate 10 made of stainless steel. The first insulating layer 41 has a uniform thickness. The ground layer 50 made of copper is formed on the first insulating layer 41. The second insulating layer 42 made of polyimide is formed on the first insulating layer 41 to cover the ground layer 50.

The upper wiring trace L10 made of copper is formed on the second insulating layer 42. The upper wiring trace L10 includes the two lines L11, L12 that constitute a differential signal line pair. The third insulating layer 60 made of polyimide is formed on the second insulating layer 42 to cover the upper wiring trace L10. The first openings 19 overlapping with the upper wiring trace L10 are formed in the support substrate 10. Further, the second openings 59 overlapping with the first openings 19 are formed in the ground layer 50.

In a direction orthogonal to a direction in which the upper wiring trace L10 extends, the dimension d4 of each second opening 59 of the ground layer 50 is smaller than the dimension d3 of each first opening 19 of the support substrate 10. Similarly, in a direction parallel to a direction in which the upper wiring trace L10 extends, the dimension d6 (FIG. 18) of each second opening 59 of the ground layer 50 is smaller than the dimension d5 (FIG. 18) of each first opening 19 of the support substrate 10.

Figure 27:
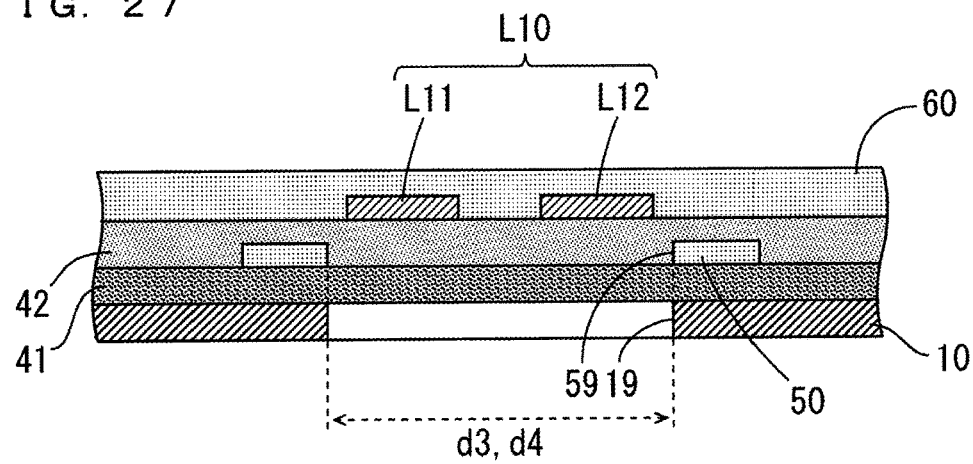
FIG. 27 is a cross sectional view of a suspension board according to a comparative example 3.

FIG. 27 is a cross sectional view of the suspension board according to the comparative example 3. The suspension board according to the comparative example 3 has the same configuration as that of the suspension board according to the inventive example 3 except for the following points. As shown in FIG. 27, in the suspension board according to the comparative example 3, the dimension d4 of the second opening 59 of the ground layer 50 is equal to the dimension d3 of each first opening 19 of the support substrate 10 in a direction orthogonal to the direction in which the upper wiring trace L10 extends. Similarly, in a direction parallel to the direction in which the upper wiring trace L10 extends, the dimension d6 (FIG. 18) of each second opening 59 of the ground layer 50 is equal to the dimension d5 (FIG. 18) of the first opening 19 of the support substrate 10.

FIG. 28 is a cross sectional view of the suspension board according to the comparative example 4. The suspension board according to the comparative example 4 has the same configuration as that of the suspension board according to the inventive example 3 except for the following points. As shown in FIG. 28, in the suspension board according to the comparative example 4, the dimension d4 of each second opening 59 of the ground layer 50 is larger than the dimension d3 of each first opening 19 of the support substrate 10 in a direction orthogonal to the direction in which the upper wiring trace L10 extends. Similarly, the dimension d6 (FIG. 18) of the second opening 59 of the ground layer 50 is larger than a dimension d5 (FIG. 18) of the first opening 19 of the support substrate 10 in a direction parallel to the direction in which the upper wiring trace L10 extends.

An S parameter Sdd21, which indicates the transmission characteristics when an electric signal is transmitted through the upper wiring trace L10 of the suspension board according to each of the inventive example 3 and the comparative examples 3, 4 was found by simulation. FIG. 29 is a diagram showing results of simulation relating to the suspension boards according to the inventive example 3 and the comparative examples 3, 4. In FIG. 29, the ordinate indicates the S parameter Sdd21 [dB], and the abscissa indicates a frequency [GHz] of an electric signal. Further, in FIG. 29, the results of simulation relating to the inventive example 3, the comparative example 3 and the comparative example 4 are indicated by a solid line, a one-dot and dash line and a two-dots and dash line, respectively.

According to the results of simulation of FIG. 29, in a frequency band from 0 to 10 GHz, an attenuation amount of an electric signal transmitted in the suspension board according to the inventive example 3 is smaller than an attenuation amount of an electric signal transmitted in the suspension board according to the comparative example 3. Further, the attenuation amount of the electric signal transmitted in the suspension board according to the comparative example 3 is smaller than an attenuation amount of an electric signal transmitted in the suspension board according to the comparative example 4. Thus, it was found that it was possible to reduce an attenuation amount of an electric signal over wide frequency bands by respectively making the dimensions d4, d6 of the second opening 59 of the ground layer 50 be smaller than the dimensions d3, d5 of the first opening 19 of the support substrate 10.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:
1. A printed circuit board comprising:
a support substrate formed of a conductive material;
a first insulating layer formed on the support substrate;
a ground layer that is formed on the first insulating layer to be electrically connected to the support substrate and has electric conductivity higher than electric conductivity of the support substrate;
a second insulating layer formed on the first insulating layer to cover the ground layer; and
an upper wiring trace formed on the second insulating layer to overlap with the ground layer and extend in a first direction, wherein
a second direction that is perpendicular to the first direction and is parallel to the support substrate, a first cross-section that is perpendicular to the first direction, and a second cross-section that is perpendicular to the second direction are defined,
a first opening is formed in the support substrate,
a second opening overlapping with the first opening of the support substrate is formed in the ground layer,
the upper wiring trace at least partially overlaps with the second opening of the ground layer,
a dimension of the second opening of the ground layer in the first direction is set such that the ground layer is partially present between the upper wiring trace and the support substrate in the second cross-section, and
a dimension of the second opening of the ground layer in the second direction is set such that the ground layer is partially present between the upper wiring trace and the support substrate in the first cross-section.
2. The printed circuit board according to claim 1, wherein a plurality of the second openings are intermittently formed in the ground layer to be arranged in the first direction.
3. The printed circuit board according to claim 1, further comprising first and second vias that penetrate the first and second insulating layers, wherein
the support substrate includes a support portion electrically connected to the ground layer and a wiring portion electrically insulated from the support portion,
the upper wiring trace includes first and second signal lines that constitute a signal line pair,
the first signal line includes first and second branch lines,
the second signal line includes third and fourth branch lines electrically connected to each other,
the first and second branch lines of the first signal line and the third and fourth branch lines of the second signal line are arranged such that any one of the first and second branch lines is located between the third and fourth branch lines, the first via electrically connects the first branch line of the first signal line to the wiring portion of the support substrate, and the second via electrically connects the second branch line of the first signal line to the wiring portion of the support substrate.

4. The printed circuit board according to claim 1, further comprising:

a relay trace formed on the first insulating layer; and first and second vias that penetrate the second insulating layer, wherein the upper wiring trace includes first and second signal lines that constitute a signal line pair, the first signal line includes first and second branch lines, the second signal line includes third and fourth branch lines electrically connected to each other, the first and second branch lines of the first signal line and the third and fourth branch lines of the second signal line are arranged such that any one of the first and second branch lines is located between the third and fourth branch lines, the first via electrically connects the first branch line of the first signal line to the relay trace, and the second via electrically connects the second branch line of the first signal line to the relay trace.

5. The printed circuit board according to claim 1, further comprising a third via that penetrates the first insulating layer and electrically connects the ground layer and the support substrate to each other.

6. The printed circuit board according to claim 1, wherein the support substrate includes stainless steel, and the ground layer includes copper.

7. The printed circuit board according to claim 1, further comprising a third insulating layer formed on the second insulating layer to cover the upper wiring trace.

\* \* \* \* \*